(12) United States Patent
Welkie

(10) Patent No.: US 8,921,803 B2
(45) Date of Patent: Dec. 30, 2014

(54) ELECTROSTATIC LENSES AND SYSTEMS INCLUDING THE SAME

(75) Inventor: David G. Welkie, Trumbull, CT (US)

(73) Assignee: PerkinElmer Health Sciences, Inc., Waltham, MA (US)

( * ) Notice: Subject to any disclaimer, the term of this patent is extended or adjusted under 35 U.S.C. 154(b) by 117 days.

(21) Appl. No.: 13/410,646

(22) Filed: Mar. 2, 2012

(65) Prior Publication Data

US 2012/0223244 A1 Sep. 6, 2012

Related U.S. Application Data

(60) Provisional application No. 61/449,193, filed on Mar. 4, 2011.

(51) Int. Cl.
*H01J 3/20* (2006.01)
*H01J 37/12* (2006.01)
*H01J 49/06* (2006.01)

(52) U.S. Cl.
CPC ...... *H01J 37/12* (2013.01); *H01J 49/06* (2013.01)
USPC .............. 250/396 R; 250/396 ML; 250/288

(58) Field of Classification Search
USPC ...................................... 250/396 R
See application file for complete search history.

(56) References Cited

U.S. PATENT DOCUMENTS

| | | |
|---|---|---|
| 3,410,997 A | 11/1968 | Brubaker |
| 3,473,020 A | 10/1969 | Brubaker |
| 3,634,645 A | 1/1972 | Lempert et al. |
| 3,859,226 A | 1/1975 | Schillalies |
| 4,047,030 A | 9/1977 | Lobach |
| 4,999,492 A | 3/1991 | Nakagawa |
| 5,171,990 A | 12/1992 | Mylchreest et al. |
| 5,420,415 A | 5/1995 | Trueira |
| 5,481,107 A | 1/1996 | Takada et al. |
| 5,663,560 A | 9/1997 | Sakairi et al. |
| 5,672,868 A | 9/1997 | Mordehai et al. |

(Continued)

FOREIGN PATENT DOCUMENTS

| | | |
|---|---|---|
| EP | 0 237 259 | 9/1987 |
| JP | 2004071470 | * 3/2004 |

OTHER PUBLICATIONS

Dawson, Peter, H., "Quadrupole Mass Spectrometry and Its Applications", 1995 by the American Institute of Physics, pp. 138-139 and 34-35.

(Continued)

*Primary Examiner* — Phillip A Johnston
(74) *Attorney, Agent, or Firm* — Fish & Richardson P.C.

(57) ABSTRACT

A system includes an electrostatic lens in a path between a charged particle source and a detector. The electrostatic lens includes: a first electrode having a first aperture in the path aligned with a first axis; a second electrode in the path between the first electrode and the detector, having a second aperture in the path and aligned with a second axis that is parallel to the first axis and displaced from the first axis along a first direction; a third electrode in the path between the first electrode and the second electrode; and a potential generator coupled to the electrodes. During operation, the potential generator applies potentials to the first, second and third electrodes so that the electrostatic lens directs a beam of charged particles from the source propagating along the first axis to propagate along the second axis.

36 Claims, 37 Drawing Sheets

(56) References Cited

U.S. PATENT DOCUMENTS

| | | |
|---|---|---|
| 5,818,041 A | 10/1998 | Mordehai et al. |
| 5,838,011 A | 11/1998 | Krijn et al. |
| 6,069,355 A | 5/2000 | Mordehai |
| 6,614,021 B1 | 9/2003 | Kalinitchenko |
| 6,730,904 B1 | 5/2004 | Wells |
| 6,914,242 B2 * | 7/2005 | Mordehai .................. 250/288 |
| 7,223,974 B2 | 5/2007 | Petrov et al. |
| 7,791,047 B2 | 9/2010 | Horsky et al. |
| 2009/0083356 A1 | 3/2009 | Welkie |
| 2009/0218486 A1 | 9/2009 | Whitehouse et al. |
| 2009/0266984 A1 * | 10/2009 | Hirano ......................... 250/288 |

OTHER PUBLICATIONS

International Search Report dated Jun. 20, 2012 for International Application No. PCT/US2012/027547, 3 pages.

International Preliminary Report on Patentability issued in PCT/US2012/027547 on Mar. 12, 2014 (9 pages).

* cited by examiner

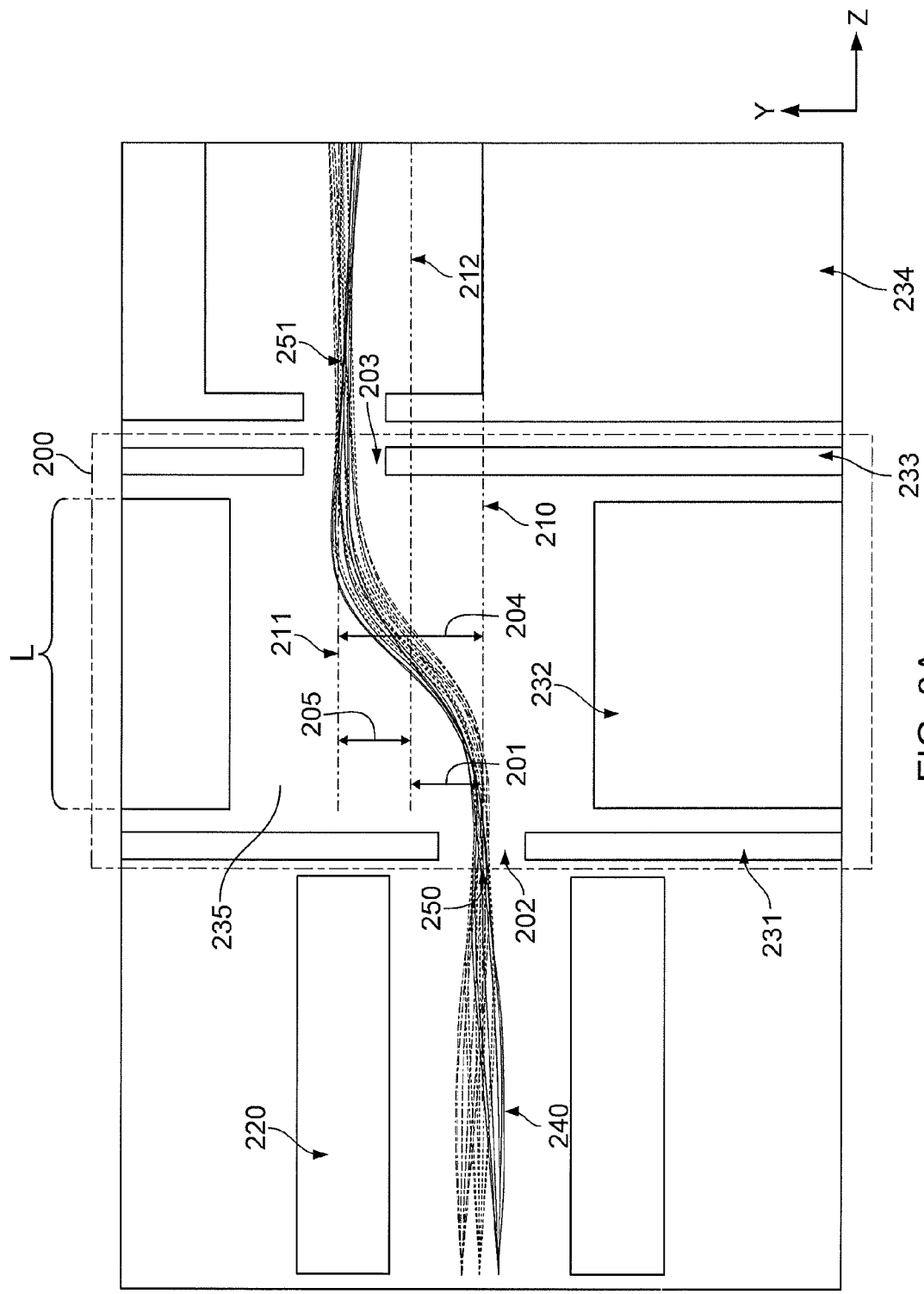

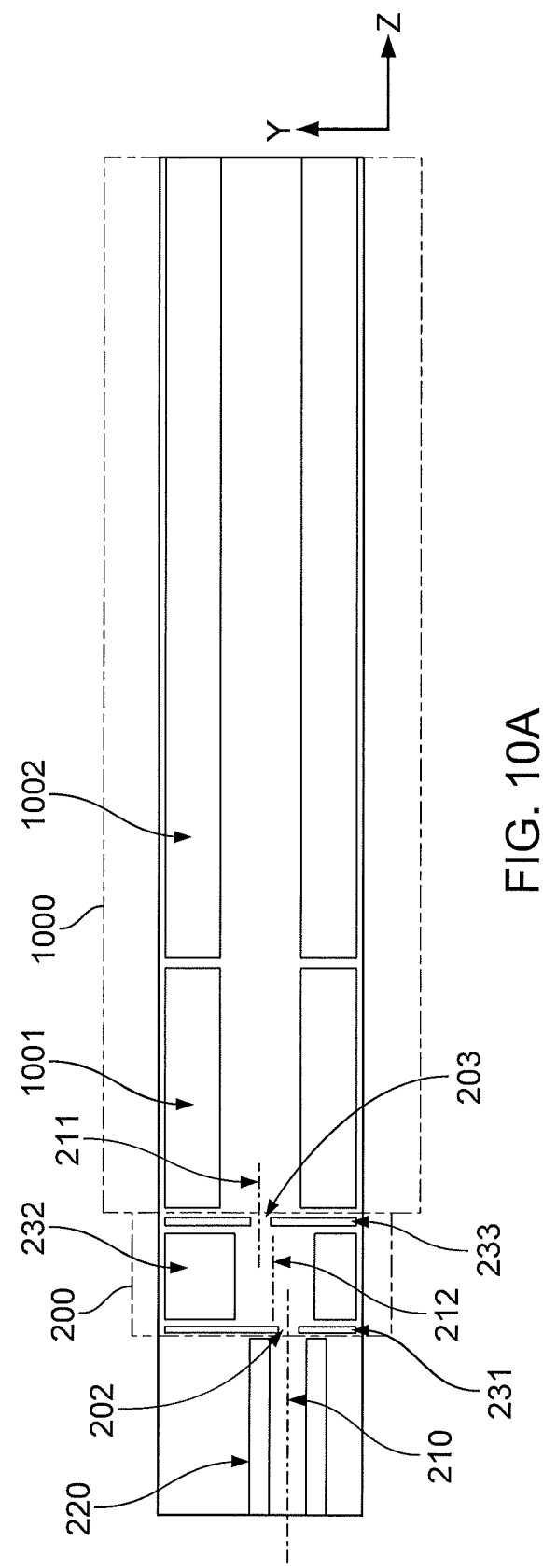

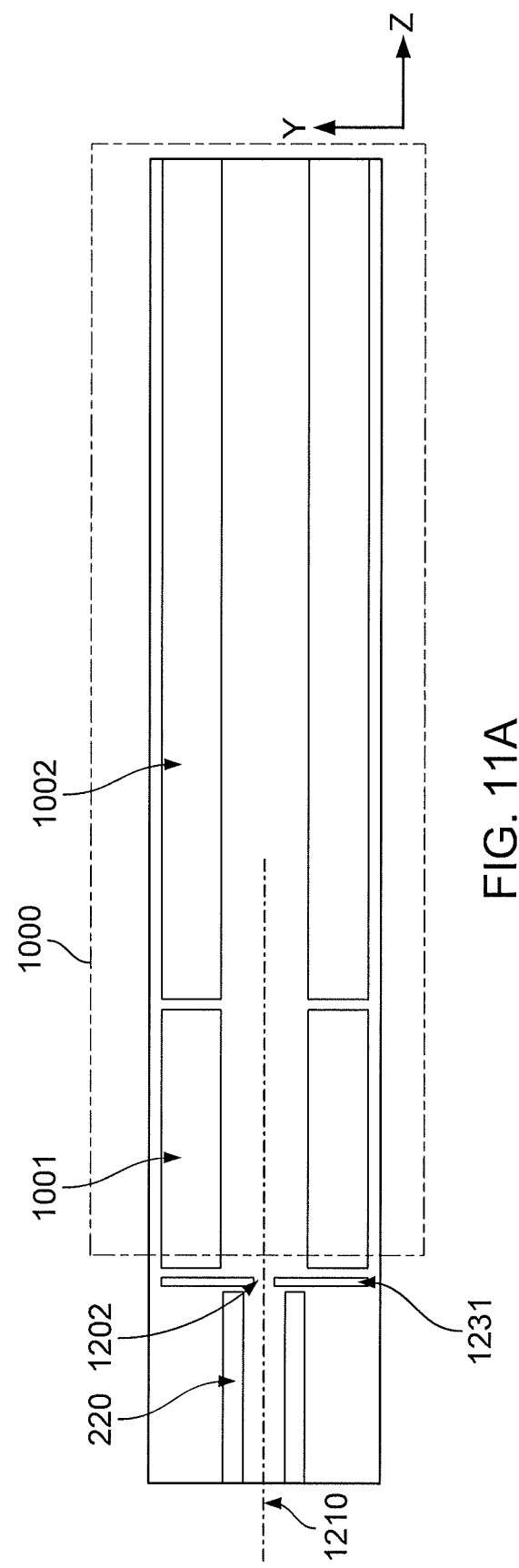

ELECTROSTATIC LENSES AND SYSTEMS INCLUDING THE SAME

CROSS-REFERENCE TO RELATED APPLICATIONS

This application claims benefit of Provisional Application No. 61/449,193, filed on Mar. 4, 2011, the entire contents of which are incorporated herein by reference.

TECHNICAL FIELD

This invention relates to electrostatic lenses and systems that include electrostatic lenses.

BACKGROUND

A variety of applications involve transmitting charged particles from one location to another. This is the case, for example, in the transmission of ions to a quadrupole mass filter and other types of mass spectrometers, and in the pulsed release of trapped ions from a multipole ion guide ion trap into the pulsing region of a time-of-flight (TOF) mass spectrometer. In addition, there is a need for an improved and finer focusing of charged particle beams in general. However, the transmission of selected ions is often accompanied by the concomitant transmission of undesirable particles, which may include charged particles with substantially higher and/or lower kinetic energy, as well as uncharged particles such as neutral species and photons.

These undesirable particles can interfere with the transmission or optimum utilization of the desired particles. For example, energetic charged and uncharged particles, such as aerosols, frequently accompany the introduction of analyte ions from an atmospheric pressure ion source into vacuum, and such 'background' particles may be very energetic, making them difficult to control or eliminate. Other examples of undesirable 'background' particles include photons that are produced, for example, in inductively coupled plasma (ICP) ion sources and electron induced ionization (EI) ion sources, as well as neutral metastable particles such as are produced in such ion sources, which can transfer energy to secondary particles to create unwanted secondary ions. All such particles can lead to undesirable consequences, such as background noise at the detector of a mass spectrometer.

In other scenarios, such as the technique of secondary ion mass spectrometry (SIMS), a finely-focused energetic ion beam impacts a small surface area of a solid sample, thereby releasing so-called secondary ions of sample surface species. Subsequent mass analysis of these secondary ions reveals the chemical composition of this small area of sample surface. However, energetic neutral particles accompanying the focused ions are not focused, and their impact creates sample surface secondary ions from outside the analysis area, which degrades the spatial specificity of the analysis.

Further, kinetic energy filters and analyzers are configured to pass charged particles with a relatively narrow range of energies with high transmission, while preventing as many particles as possible with kinetic energies outside this narrow range from passing to a detector.

SUMMARY

It has been discovered that electrostatic lenses can be configured according to the invention to reduce or remove undesirable background particles from an ion beam, while maintaining good optical qualities that result in high ion transmission efficiency and good focusing characteristics. In mass spectrometry applications, such lenses are effective for improving the signal to noise ratio by preventing such undesirable particles from creating background noise, either due to direct detector impact, or by creating secondary particles from surfaces, which subsequently impact a detector. In focused ion beam applications, such lenses are similarly useful for the elimination of neutral species in the ion beam, resulting in improved analytical performance. Such reduction or elimination of background particles can also alleviate the buildup of an electrically insulating layer of contaminants on surfaces that is caused by the impingement and deposition of parasitic background particles, which results in detrimental charging effects. In some embodiments, an electrostatic lens is placed in a low vacuum region of a mass spectrometer to ensure that transmission efficiency of ions is not significantly degraded due to scattering of ions out of the particle path by background gas molecules. In contrast, RF ion guides are often used to transportions through regions of both relatively high and low vacuum pressures, since the RF fields within the ion guide generally prevent such collisional losses. However, ion transmission losses, and/or degradation of the optical properties of the ion beam, may nevertheless occur as ions exit the end of an RF ion guide, where ions may be scattered by RF fringe fields and/or collisions with background gas molecules. Further, while electrostatic lenses can focus or otherwise re-direct the trajectories of ions with electrostatic fields, such is not possible with RF ion guides, apart from guiding ions along the ion guide axis, and notwithstanding the collisional cooling effects due to collisions between ions and background molecules within the central portion of an ion guide. Hence, an electrostatic lens offers the potential for transmitting and focusing an ion beam via electrostatic fields with greater overall transmission efficiency and better focusing than an RF ion guide, while preventing the transmission of undesirable particles.

Various aspects of the invention are summarized below.

In general, in one aspect, the invention features a system that includes an electrostatic lens positioned in a path between a charged-particle source and a charged-particle detector. The electrostatic lens includes: a first electrode having a first aperture positioned in the path and aligned with a first axis; a second electrode positioned in the path between the first electrode and the charged-particle detector, the second electrode having a second aperture positioned in the path and aligned with a second axis, the second axis being parallel to the first axis and displaced from the first axis along a first direction; a third electrode positioned in the path between the first electrode and the second electrode; and a potential generator coupled to the first, second, and third electrodes. During operation, the potential generator applies a first potential to the first electrode, a second potential to the second electrode, and a third potential to the third electrode so that the electrostatic lens directs a beam of charged particles from the charged-particle source propagating along the first axis to propagate along the second axis.

Embodiments of the system can include one or more of the following features. For example, during operation the electrostatic lens can guide charged-particles in the beam having kinetic energies within a first range through the second aperture while charged-particles entering the electrostatic lens through the first aperture having kinetic energies outside the first range are prevented from passing through the second aperture.

The path at the first electrode can be parallel to the path at the second electrode.

The first electrode can be a plate electrode. The second electrode can be a plate electrode. In some embodiments, the first and second electrodes are plate electrodes. The plate electrodes can be parallel. The plate electrodes can be orthogonal to the first and second axes.

The third electrode can include a hole through which the path extends. The hole can have a third axis. The hole can have a hole cross-section that is the same throughout the entire third electrode. The hole can have a cross-section that is different at at least one axial location than the hole cross-section at other axial locations. The third electrode hole can have a cylindrical cross-section, wherein the third axis is the axis of the cylindrical cross-section. The third electrode hole can have an elliptical cross-section having a major diameter and a minor diameter different from the major diameter, wherein the major diameter or the minor diameter is parallel to the first direction. The third electrode hole can have an oval cross-section, wherein the oval comprises a rectangle centered on the first hole axis, wherein first and second sides of the rectangle are parallel to the first direction, and third and fourth sides of the rectangle are perpendicular to the first direction, and wherein the oval further comprises a first and second cylinder, the first cylinder being centered on the mid-point of the rectangle third side, and the second cylinder being centered on the mid-point of the rectangle fourth side, wherein the diameters of the first and second cylinders are the same as the length of the third and fourth sides. The hole can have a plane of symmetry which includes the third axis, and which is perpendicular to the first direction. The hole can have a plane of symmetry which includes the third axis, and which also includes the first axis and the second axis. The hole can have two planes of symmetry, both of which includes the third axis, wherein one symmetry plane is perpendicular to the first direction, and wherein the second symmetry plane also includes the first axis and the second axis. The third electrode can include two half electrode sections electrically isolated from each other, each half section being the mirror-image of the other half-section, wherein the plane of symmetry between the half-sections includes the third axis, and the first and second axes, and wherein the potential generator further provides a differential voltage between the two half-sections. The first third axis can be parallel to the first and second axes and displaced in the first direction relative to the first axis and the second axis. The first and second axes can be displaced from the third axis by the same amount.

The first and second potentials can be the same potential.

The electrostatic lens can further include a fourth electrode positioned in the path between the second electrode and the charged-particle detector, the fourth electrode having a third aperture positioned in the path and aligned with a fourth axis, the fourth axis being parallel to the second axis and displaced from the second axis along the first direction and a fifth electrode positioned in the path between the second electrode and the fourth electrode. The fourth axis can be co-axial with the first axis. During operation, the potential generator can apply a fourth potential to the fourth electrode and a fifth potential to the fifth electrode so that the electrostatic lens directs the beam of charged particles from propagating along the first axis to propagate along the fourth axis. The fourth potential can be the same as the first potential or the second potential. The fifth potential can be the same as the third potential.

The system can include a vacuum chamber, wherein the electrostatic lens is positioned in the vacuum chamber.

The system can include one or more of the group consisting of a charged-particle guides, an electrostatic lens, a magnetic lens, an electrostatic deflector, and a magnetic deflector, positioned in the path between the charged-particle source and the electrostatic lens. The charged-particle guide can include a multipole charged-particle guide. The multipole charged-particle guide can be a hexapole charged-particle guide.

The charged-particle source can be an ion source. The ion source can operate essentially at atmospheric pressure. Alternatively, the ion source can operates at vacuum pressures.

The charged-particle source can be an electron source.

The system can include a mass analyzer.

Any of the electrodes can include a division of the electrode into two half sections along the plane that includes the first direction and the first axis, whereby a steering voltage may be applied to any of the half sections to steer the ions orthogonal to the plane.

In general, in a further aspect, the invention features a system, including an electrostatic lens positioned in a path between a charged-particle source and a charged-particle detector. The electrostatic lens includes a first electrode having a first aperture positioned in the path and aligned with a first axis; a second electrode positioned in the path between the first electrode and the charged-particle detector, the second electrode having a second aperture positioned in the path and aligned with a second axis, the second axis being parallel to the first axis and displaced from the first axis along a first direction; a third electrode positioned in the path between the first electrode and the second electrode; and a potential generator coupled to the first, second, and third electrodes. During operation, the potential generator applies a first potential to the first electrode, a second potential to the second electrode, and a third potential to the third electrode so that the electrostatic lens guides a beam of charged-particles within a first range of kinetic energies entering the electrostatic lens through the first aperture through the second aperture while charged-particles entering the electrostatic lens through the first aperture having a kinetic energy outside the first range are prevented from passing through the second aperture. Embodiments of the system can include one or more features of other aspects.

In general, in a further aspect, the invention features a system that includes an electrostatic lens positioned in a path between a charged-particle source and a charged-particle detector. The electrostatic lens includes a first electrode having a first aperture positioned in the path and aligned with a first axis; a second electrode positioned in the path between the first electrode and the charged-particle detector, the second electrode having a second aperture positioned in the path and aligned with a second axis, the second axis being parallel to the first axis and displaced from the first axis along a first direction; a third electrode positioned in the path between the first electrode and the second electrode; a fourth electrode positioned in the path between the second aperture and the charged particle detector, the fourth electrode having a fourth aperture positioned in the path and aligned with the second axis; and a potential generator coupled to the first, second, third, and fourth electrodes. During operation, the potential generator applies a first potential to the first electrode, a second potential to the second electrode, and a third potential to the third and fourth electrodes, so that the electrostatic lens guides a beam of charged-particles, having a first range of kinetic energies entering the electrostatic lens through the first aperture, through the second and fourth apertures, while charged-particles entering the electrostatic lens through the first aperture having a kinetic energy outside the first range are prevented from passing through the second and fourth apertures. Embodiments of the system can include one or more features of other aspects.

In general, in another aspect, the invention features a system that includes an electrostatic lens positioned in a path between a charged-particle source and a charged-particle detector. The electrostatic lens includes a first electrode having a first aperture positioned in the path and aligned with a first axis; a second electrode positioned in the path between the first electrode and the charged-particle detector, the second electrode having a second aperture positioned in the path and aligned with a second axis, the second axis being parallel to the first axis; and a third electrode positioned in the path between the first electrode and the second electrode, the third electrode being a cylindrical electrode having a cylindrical axis parallel to the first and second axes, the cylindrical axis being offset by equal amounts from the first and second axes in a first direction; and a potential generator coupled to the first, second, and third electrodes. During operation, the potential generator applies a first potential to the first electrode, a second potential to the second electrode, and a third potential to the third electrode to focus a beam of charged particles from the charged-particle source propagating along the path from a first crossover on the first axis to a second crossover on the second axis. Embodiments of the system can include one or more features of other aspects.

In general, in a further aspect, the invention features a method that includes directing a beam of charged-particles having a range of kinetic energies within a first energy range along a path through an entrance aperture of an electrostatic lens, the electrostatic lens comprising a first electrode that includes the entrance aperture, a second electrode comprising a second aperture positioned in the path, and a third electrode positioned in the path between the first and second electrodes, wherein the first and second apertures are aligned with first and second parallel axes, respectively, displaced from each other in a first direction; and applying voltages to the first, second, and third electrodes so that the beam is transmitted through the second aperture while charged-particles entering the electrostatic lens through the entrance aperture having kinetic energies outside the range of kinetic energies are blocked by the electrostatic lens. Implementations of the method can include one or more features of the other aspects.

Embodiments can include a variety of advantages. For example, the achievable performance of various analytical techniques that use charged particle beams can be improved using electrostatic lenses disclosed herein. In some embodiments, the electrostatic lenses can improve analytical sensitivity by reducing background noise at a detector in a system using such a lens. Lenses can reduce background noise in measurements by removing background particles and other species not selected for analysis from a charged particle beam. Generally, the background particles are removed by electrostatic lens systems that contain an aperture that is off-axis with respect to the incident charged particle beam path.

In other embodiments, similar electrostatic lenses according to the invention are provided as a component in an optical configuration that produces a focused beam, for example, an ion beam focused to a small cross-section for ion sputter-etching a small region of a surface. Such beam-forming ion optical configurations are typically designed to transport and focus an ion beam from an ion source to a focus at a solid sample surface with high transmission efficiency while minimizing optical aberrations. Such aberrations result in reduced ion current density in the final focused spot on the sample. On the other hand, neutral species created in the ion source or through collisions between ions and background gas molecules or surfaces along the beam path, are not focusable, and so can cause sputter-etching of a surface outside the region of the focused ion spot, thereby degrading the quality of the etching, and/or producing sputtered species not representative of the sample material within the focused spot. Embodiments of electrostatic lens are provided that reduce or eliminate such neutral species in the beam path, without introducing significant optical aberrations in the ion beam. In particular, some embodiments minimize astigmatism in the beam focus.

In even other embodiments, similar electrostatic lenses are configured to transmit and focus a beam of charged particles having a narrow range of kinetic energies, while preventing other charged particles having kinetic energies outside this narrow range from passing.

The electrostatic lenses and systems disclosed herein can be simple in mechanical designs and/or simple to fabricate. For example, electrostatic lenses can be formed from a relatively small number of component electrodes, which are easily assembled to form the lens, often within a relatively compact space, and with simple geometrical contours, such as plane, cylindrical, and elliptical surface contours. As a result, the cost and/or complexity of manufacturing lenses can be relatively low.

The details of one or more embodiments are set forth in the accompanying drawings and the description below. Other features and advantages of the invention will be apparent from the description and drawings, and from the claims.

DESCRIPTION OF DRAWINGS

FIG. 8(a) is a cross-sectional view of the components shown in FIG. 2(a). Trajectories for the ions of FIG. 5 are shown for conditions different to those depicted in FIG. 2(a).

FIG. 10(a) is a cross-sectional view of the components shown in FIG. 2(a) coupled to a quadrupole mass filter.

FIG. 11(a) is a cross-sectional of the hexapole and exit lens shown in FIG. 2(a) coupled to the quadrupole mass filter of FIG. 8(a), where all components are co-axial.

Like reference symbols in the various drawings indicate like elements.

DETAILED DESCRIPTION

Figure 1:
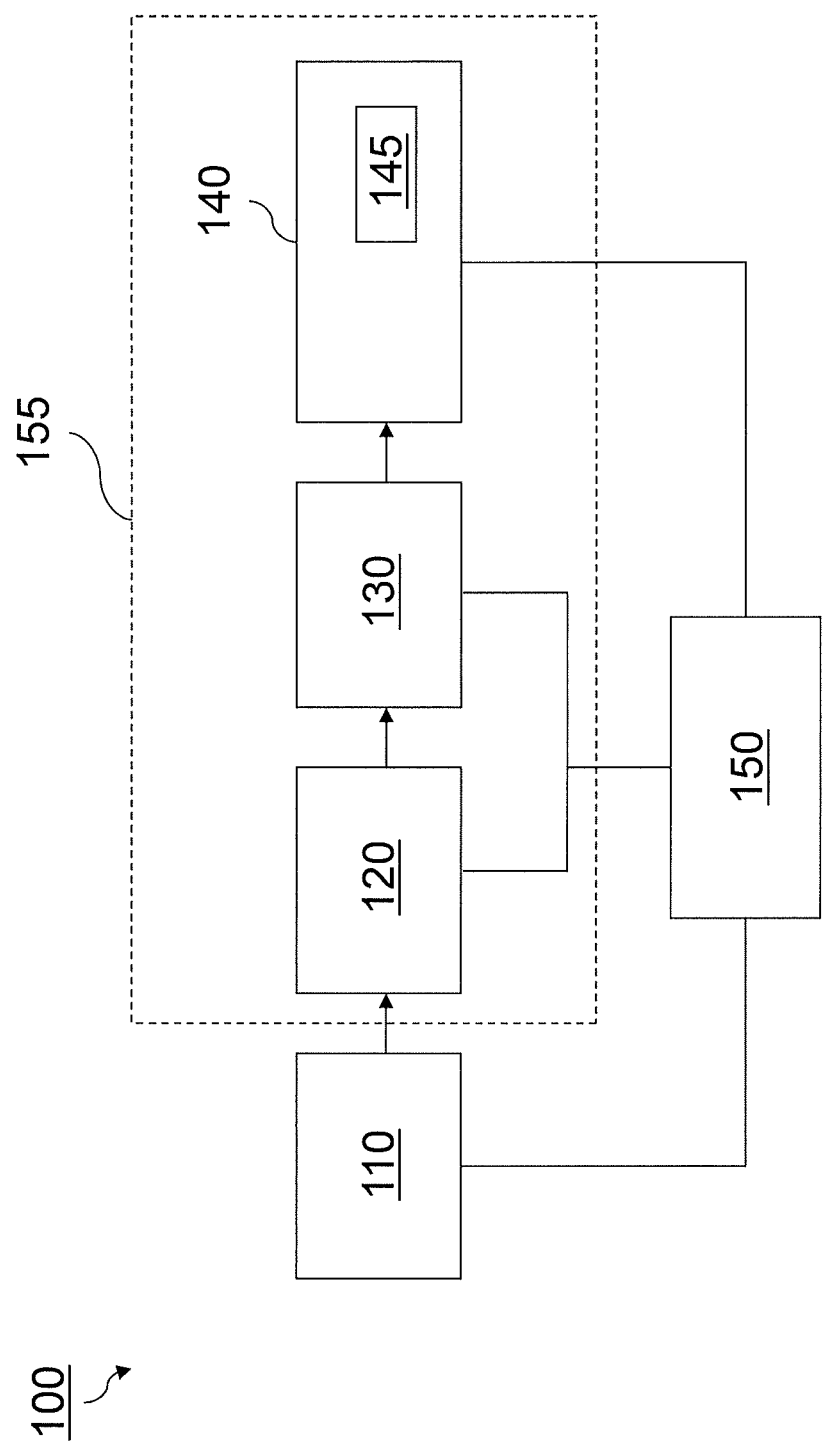
FIG. 1 is a schematic diagram showing an embodiment of a mass spectrometry system.

Referring to FIG. 1, a mass spectrometer system 100 includes an ion source 110, which creates ions from a sample under analysis; an ion transport assembly 120 (which may include, e.g., one or more RF multipole ion guides, and/or electrostatic focusing lenses and/or apertures, and/or deflectors and/or capillaries, as is well-known in the art); an electrostatic lens assembly 130; an analyzer assembly 140; and an electronic controller 150. Ion transport assembly 120, electrostatic lens assembly 130, and analyzer assembly 140 are housed in one or more vacuum chambers 155. Analyzer assembly 140 includes a detector 145. During operation of system 100, ion source 110 generates ions that are transported by ion transport assembly 120 to electrostatic lens assembly 130. Lens assembly 130 directs the ions to analyzer assembly 140 where the ions are analyzed as a function of their mass to charge ratio (m/z) through the application of appropriate electric and/or magnetic fields in analyzer assembly 140. As a consequence, ions of a particular m/z impinge on detector 145 at any particular point in time, generating a signal proportional to their abundance. A mass spectrum can be obtained by recording the abundance of ions present in a sample over a selected m/z ratio range, for example.

In general, a variety of ion sources can be used for ion source 110. Ion sources can be broadly classified into sources that provide ions at atmospheric pressure, so-called atmospheric pressure ion (API) sources, and sources that provide ions at non-atmospheric pressures (e.g., reduced pressures). Examples of API sources include electrospray ionization (ESI), atmospheric pressure chemical ionization (APCI), inductively coupled plasma (ICP), glow discharge (GD) and atmospheric pressure matrix assisted laser desorption ionization (MALDI) sources. Non-atmospheric pressure ion sources typically operate in vacuum or partial vacuum. Examples of non-atmospheric ion sources can be chemical ionization (CI), electron ionization (EI), fast atom bombardment (FAB), flow FAB, laser desorption (LD), MALDI, thermospray (TS) and particle beam (PB) sources.

In general, ion transport assembly 120 may include one or more ion guides arranged to transportions between different locations within mass spectrometer system 100. In some embodiments, ion guides are also used to trap ions. Examples of ion guides can include RF multipole ion guides, which typically contain multiple parallel electrodes arranged symmetrically along an axis (e.g., quadrupole, hexapole and octapole ion guides, which features four, six, and eight electrodes or poles, respectively). Other types of RF ion guides, such as stacked-ring ion guide, or helical ion guides, as are well known in the art, may be used as well.

An ion guide of assembly 120 can be housed in a single pressure region in the mass spectrometer 100 or it can extend continuously through multiple regions with different background pressures. In some embodiments, a single ion guide can extend continuously between two or more pressure regions. In such configurations, the background gas pressure may be high enough in the upstream portion of the ion guide to cause collisional cooling of ions, while the background gas pressure in the downstream portion of the ion guide may be low enough that collisions between ions and background gas molecules are negligible. Some ion guides feature more than one segment. Each segment can have dedicated electronic controls that enable independent adjustments of AC (e.g., radio frequency (RF)) and/or DC electric fields supplied to each segment or assembly of the multipole ion guide. Through the application of appropriate electric fields, ion guides can perform m/z selection on ions that traverse through the guides. For example, m/z selection can be performed through resonant frequency rejection of unwanted ions, ion m/z selection using AC and DC potentials with or without trapping of ions, or removing unwanted ion m/z values by scanning the RF amplitude or frequency of the electric field applied to the multipole ion guide.

Alternatively, or additionally, ion guides can be used to perform ion fragmentation. For example, DC voltages applied between different ion guides or different ion guide segments can first accelerate ions within an ion guide or segment and cause ions from one ion guide or segment to accelerate into another ion guide or segment, leading to collisions between the accelerated ions and ions already present in that ion guide or segment. These collisions result in the fragmentation of ions.

Electrostatic lens assembly 130 includes an electrostatic lens that directs selected ions exiting ion transport assembly 120 toward analyzer assembly 140. The lens can also be used to increase the sensitivity of mass spectrometer system 100 by filtering out undesired particles that cause background noise.

In general, the electrostatic lens features one or more electrodes that are coupled to a potential generator, which applies an electrostatic potential to each electrode. Differences in potentials between the electrodes generate electric fields that influence the trajectory of ions traversing the lens. The electrostatic lens reduces the number of undesirable particles, generated upstream of the lens, that are transmitted to analyzer assembly 140. While specific embodiments of electrostatic lenses are described below, in general, the electrostatic lens has at least one electrode having an aperture that is off-axis with respect to the path of ions entering the lens. Applying appropriate potentials to the lens electrodes generates electrostatic fields that steer and focus selected ions within the ion beam through the off-axis aperture to analyzer assembly 140. Other ions and/or neutral particles and/or photons follow different trajectories and are not directed through the off-axis aperture. Accordingly, at least some of the non-selected ions and/or particles and/or photons are occluded by the electrostatic lens and do not enter analyzer assembly 140.

A variety of different analyzers can be used for analyzer assembly 140. Examples include quadrupole mass filters, two- and three-dimensional ion traps, Wien filters, and time of flight (TOF) and hybrid quadrupole TOF mass analyzers.

Similarly, a variety of different detectors can be used. For example, detector 145 can be an electron multiplier, photomultiplier, or Faraday cup detector, which generates a signal proportional to the number of particles that impinge on the surface of the detector.

Signals from the detector are recorded with a data acquisition system, generally included as a subsystem of electronic control system 150. Control system 150 is also in communication with ion source 110, ion guide assembly 120, and electrostatic lens assembly 130, coordinating data acquisition and analysis with the operation of the various components of system 100. Accordingly, control system 150 can include power supplies and electrical connections for applying electric fields (e.g., AC and/or DC) to ion transport assembly 120 and electrostatic lens assembly 130, in addition to electronic processors and input (e.g., keyboards or keypads) and output devices (e.g., one or more displays) that facilitate operation of the system.

In the description that follows, charged particles generated by ion source 110 are assumed to be positive ions, nonetheless it should be understood that the systems disclosed herein work just as well for negative ions or electrons, in which cases the voltages applied to the electrodes of the electrostatic lens would be of the opposite polarities from those described below.

Figure 2A:
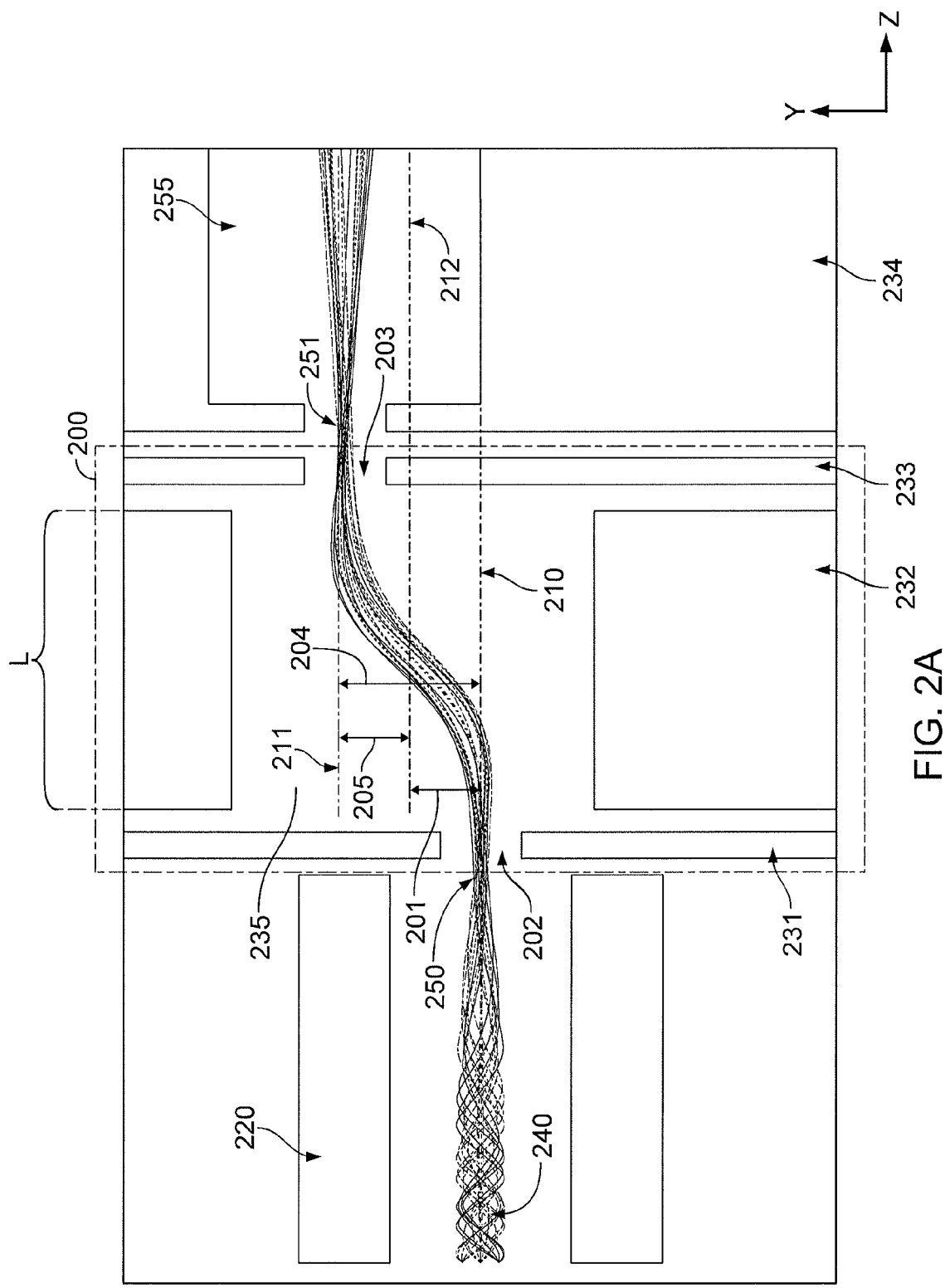
FIG. 2(a) shows a cross-sectional view of components of an embodiment of a mass spectrometry system including an electrostatic lens. Certain ion trajectories are shown.
Figure 2B:
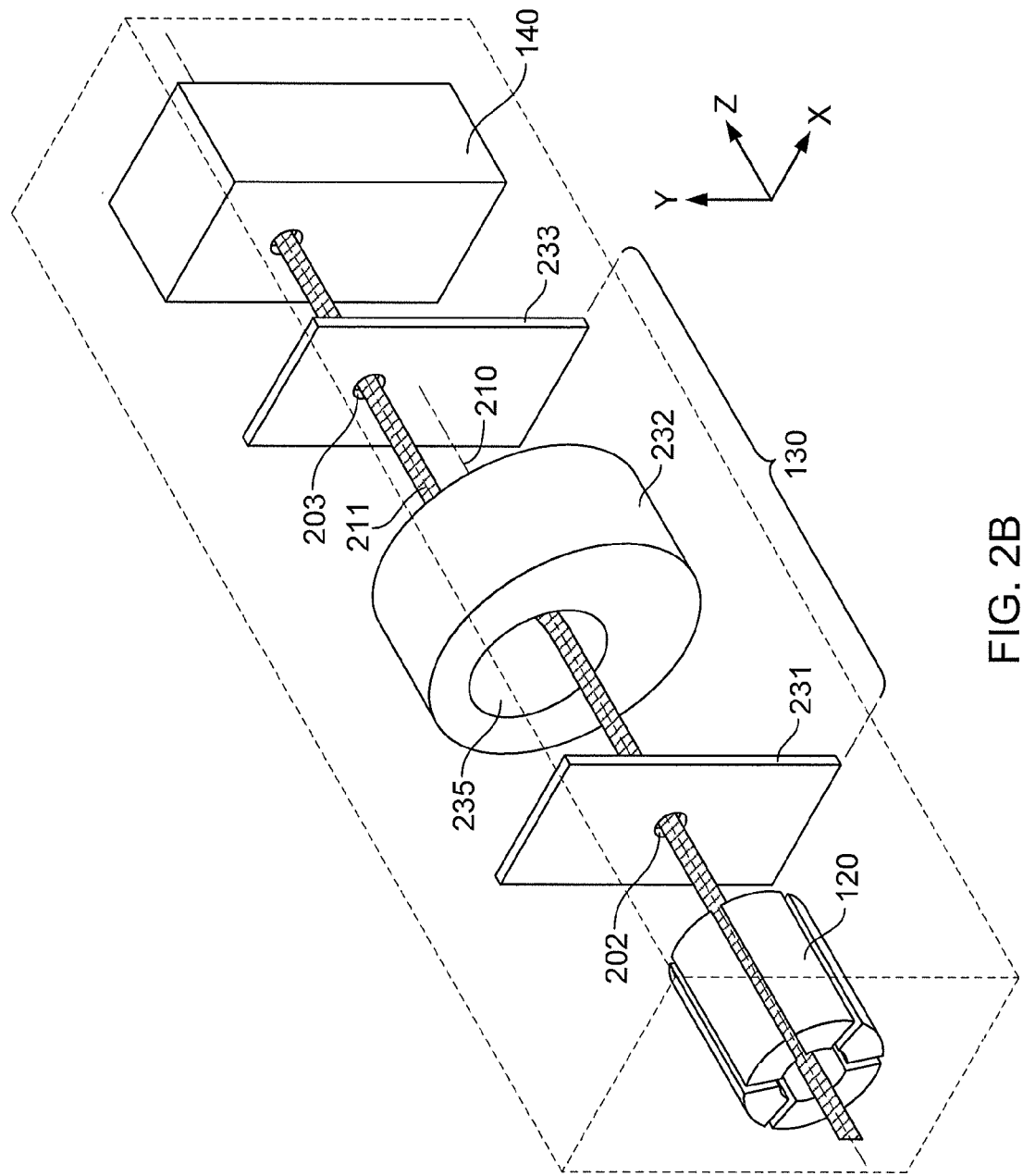
FIG. 2(b) is a perspective view of the components shown in FIG. 2(a).

Turning now to specific examples of electrostatic lenses, FIGS. 2(a) and 2(b) show, in cross-section and perspective view, respectively, a portion of an ion guide 220 (e.g., an RF multipole ion guide, such as a hexapole ion guide), incorporated in this embodiment as a component of ion transport system 130 of FIG. 1, positioned adjacent to an electrostatic lens 200, which includes an entrance electrode plate 231, a cylindrical central electrode 232, and an exit electrode plate 233. Entrance electrode plate 231 and exit electrode plate 233 are flat plates having faces that are parallel to each other (and parallel to the x-y plane of the reference Cartesian coordinate system). Electrode plate 231 has an aperture 202, which is aligned on a common axis 210 with ion guide 220. Electrode plate 233 has an aperture 203 aligned on an axis 211 displaced in the y-direction by a distance 204 from axis 210. Central electrode 232 includes a cylindrical hole/bore (or 'hole') 235, with cylinder axis 212 being displaced in the y-direction from common axis 210 by a distance 201 midway to axis 211 of electrode plate 233, such that distance 201 essentially equals distance 205. In general, alternative embodiments of the invention may be configured in which distance 205 is not equal to distance 201, or, in which the hole 235 is not cylindrical, but may have an elliptical cross-section, for example, as described in more detail below, in order to reduce astigmatism in the beam exiting the lens. Axes 210, 211 and 212 are all parallel to the z-axis, with central round hole/bore 235 extending continuously a length, L, in the z-direction. In addition, it will be found in some embodiments that better optical properties of the ion beam will result when the lens potentials are adjusted to direct the ion beam exiting the lens along a beam axis that is at an angle with respect to the aperture 203 axis 211.

In some embodiments, an additional electrode 234 downstream from plate electrode 233 may be included to, e.g., provide additional focusing. Electrode 234 includes a cylindrical channel 255 coaxial with axis 211. Electrode 234 can be a component of another device, such as a mass filter (e.g., a quadrupole mass filter) positioned immediately downstream from electrostatic lens 200 where electrode 234 is shown.

During operation, plate electrode 231 is set at a first voltage, V1, electrode 232 set at a second voltage, V2, and plate electrode 233 is set at a third electrode, V3. Voltages V1, V2, and V3 are selected so that ions, having a charge and kinetic energies within certain preselected ranges propagating along axis 210 entering lens 200 from ion guide 220, are deflected to exit lens 200 through aperture 203 while propagating along axis 211. In general, V1 is different from V2. V1 can be the same or different from V3.

In some embodiments, the ions propagating along axis 210 in ion guide 220 have very low kinetic energies and a relatively narrow kinetic energy distribution. Such kinetic energy distributions can result, for example, from ions that had previously undergone so-called collisional cooling at higher background gas pressures. In such a case, a DC offset voltage applied to ion guide 220, to which the RF voltages are referenced, also represents the approximate initial DC potential of ions entering lens 200 to which downstream potentials (e.g., the potentials of the lens electrodes) are referenced. In other words, the approximate kinetic energies of the ions at any downstream position after exiting ion guide 220 is the charge on the ion multiplied by the potential difference between the ion guide DC voltage offset and the local potential at a particular downstream position.

Included in FIG. 2(a) are ion trajectories 240, which were calculated using computer electro-optical model simulations using the commercially available Simion 8.0 potentials and trajectories calculation program. For the purpose of the simulation, ion guide 220 was a RF hexapole ion guide, having an inscribed circle diameter of 4 mm, and to which an offset voltage of 0 V was applied. The electrostatic lens electrode voltages were:

| V1 | V2 | V3 |
|---|---|---|
| −100 V | 2.7 V | −100 V |

As demonstrated by ion trajectories 240, ions which have an initially low kinetic energy, in this example which is 0.2 eV, in ion guide 220, are accelerated and focused to a first crossover 250 on axis 210 in the y-z plane as they approach and traverse electrode 231 through aperture 202. A crossover of an ion beam, as used herein, is the location at which the ion beam has a minimum diameter as measured in some direction orthogonal to the beam axis, such as the y-direction in the y-z plane of FIG. 2(a), relative to similarly measured beam diameters at adjacent axial positions. In other words, the beam size, measured in the y-direction in this example, increases for both higher and lower axial positions relative to the position of the crossover. In general, the axial location of a crossover in one plane (such as the y-z plane) may not coincide, that is, at the same position on the beam axis, with the crossover in another orthogonal plane (such as the x-z plane), in which case the beam is said to be 'astigmatic'. When the crossovers in orthogonal planes do essentially coincide at the same axial location, the beam is called 'stigmatic'.

As ions pass through aperture 202, the potential gradients between electrodes 231 and 232 cause the ions to decelerate initially, thereby changing the original trajectory of the ion beam, and causing the beam to be steered toward axis 212. However, as the ions approach axis 212, the potential gradients between electrodes 232 and 233 increasingly influence the ions and re-accelerate them in a more axial direction, causing the beam of ions to once again change course, this time towards exit electrode aperture 203 along axis 211, and the ions are focused to a second crossover 251, now on the axis 211, in the y-z plane. As will be described in more detail below, the axial location of the cross-over 251 depends on the dimensions of the lens geometry, for a given incoming beam kinetic energy.

Figure 3:
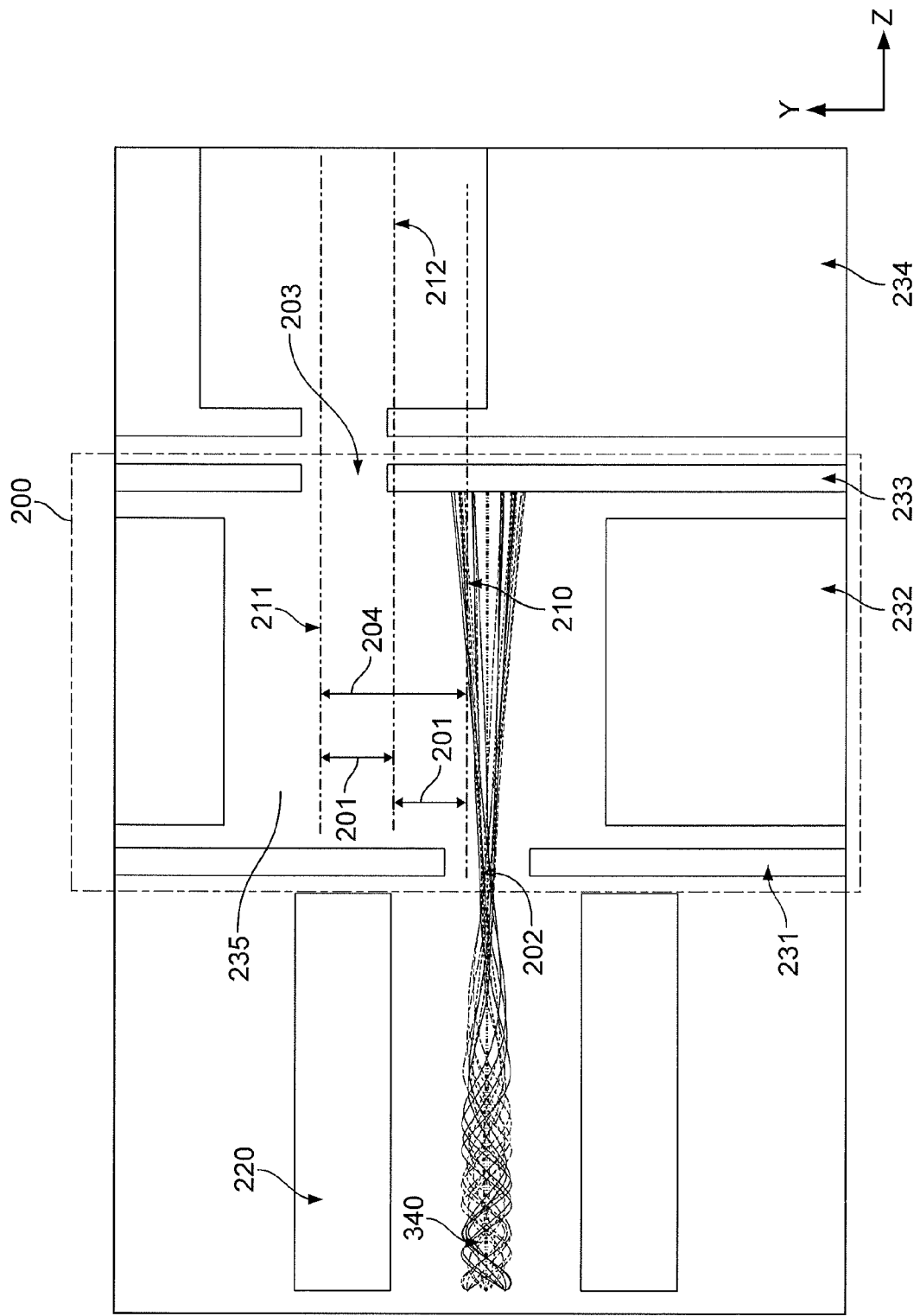
FIG. 3 is a cross-sectional view of the components shown in FIG. 2(a). Ion trajectories are shown for conditions different to those depicted in FIG. 2(a), specifically when no electric field is generated within the electrostatic lens.

As the ions pass through exit electrode aperture 203, their kinetic energies and trajectories, as projected onto the y-z plane, become similar to the kinetic energies and trajectories they had as they passed through entrance electrode aperture 202. This is illustrated by ion trajectories 340 shown in FIG. 3 which are calculated for the case where V2=−100V, instead of 2.7V as for ion trajectories 240 shown in FIG. 2(a). Since, V1=V2=V3, a field-free region exists downstream of entrance electrode aperture 202 in hole/bore 235, as there is no potential difference between electrodes 231 and 232 and 233. As a result, ions entering hole/bore 235 continue their trajectories along axis 210 as part of a diverging ion beam and are blocked by electrode 233. Contrasting trajectories 340 downstream of aperture 231 in a field-free region in FIG. 3, with trajectories 240 downstream of aperture 233 in FIG. 2(a), illustrate that the effect of electrodes 231, 232, and 233 in the y-z plane is to offset the beam axis of the initial ion beam (coaxial with axis 210) in the y-direction, as well as to relocate the beam crossover along the z axis, while leaving beam characteristics such as the beam angular distribution in they direction essentially unchanged.

It should be understood that the voltages applied to the hexapole offset, V1, V2, and V3 could all be increased or decreased by the same amount, and the same ion trajectories as depicted in FIG. 2(a) would result, since the same potential gradients, that is, electric fields, would result.

Also, electrostatic lenses according to the invention can provide similar focusing characteristics for ions having other nominal kinetic energies that are limited only by electric breakdown considerations, as with conventional electric lenses, while blocking ions having kinetic energies differing significantly from the initial nominal energy. The range of kinetic energies that are blocked by a lens with particular dimensions, while passing ions of a particular nominal kinetic energy, depends on the voltages applied to the lens electrodes, V1, V2, and V3. Therefore, for an ion beam containing ions with a distribution of kinetic energies, lenses according to the subject invention can help to 'filter out' ions with kinetic energies significantly different from those of the transmitted beam ions.

Figure 5:
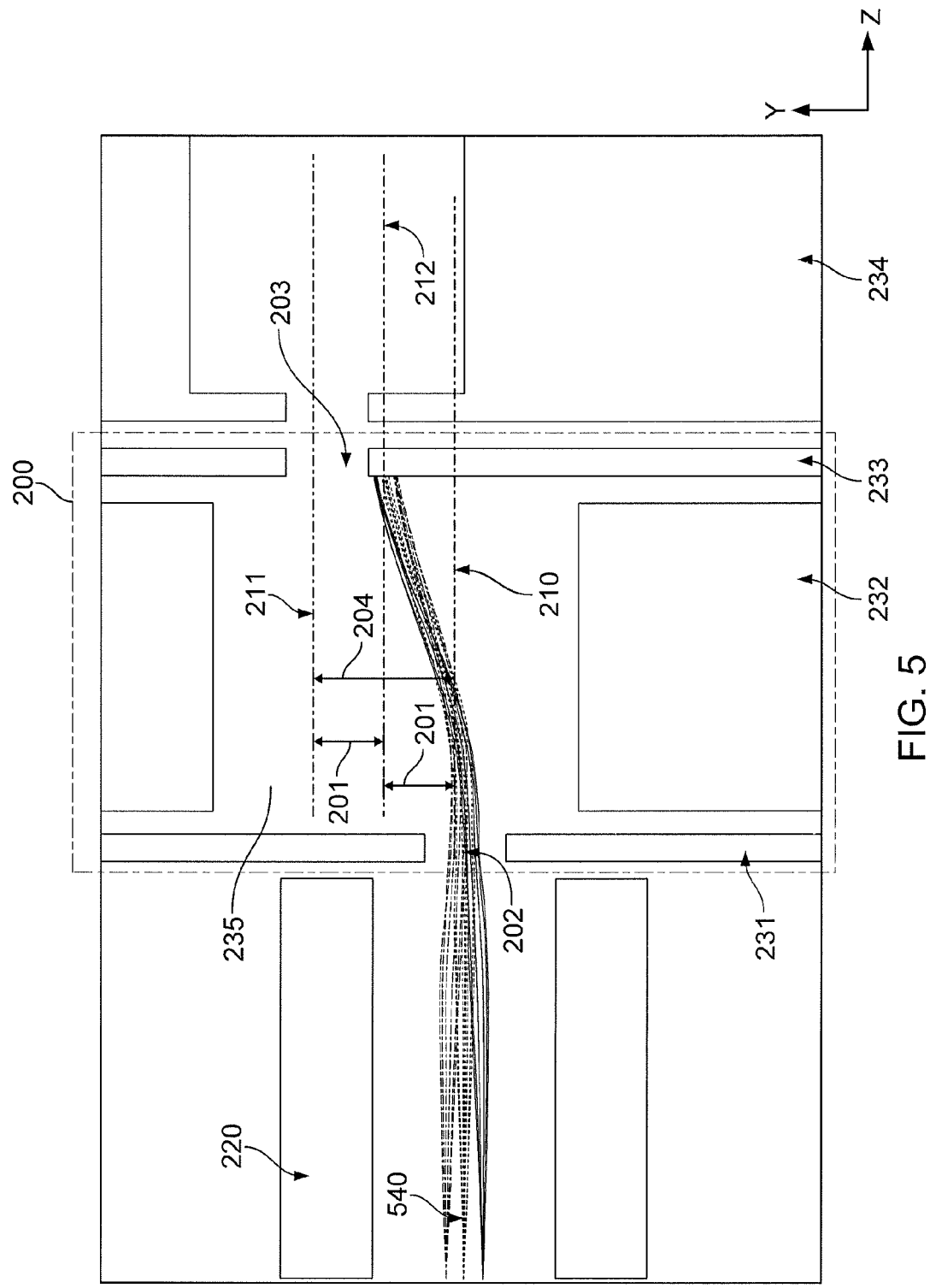
FIG. 5 is a cross-sectional view of the components shown in FIG. 2(a), showing alternative ion trajectories, specifically for ions with greater kinetic energies than the ions of FIG. 2(a).

Referring to FIG. 5, as an illustrative example, ion beam trajectories 540 are shown for lens 200 in the y-z plane. Trajectories 540 correspond to the path of ions having an initial kinetic energy in ion guide 120 of 35 eV. In comparison with the trajectories of ions with near 0 eV kinetic energies (e.g., nearly thermal kinetic energies) depicted in FIGS. 2(a) and 3, ions having relatively high kinetic energy are deflected from axis 210 by a smaller amount within hole/bore 235 than lower energy ions. Consequently, the ions with higher kinetic energy are not deviated sufficiently from their initial trajectories along original beam axis 210 to pass through exit aperture 203 and consequently are removed from the ion beam that exits lens 200. Likewise, ions with any higher initial kinetic energies than 35 eV will be even less responsive to the potential gradients within the lens, and will be similarly removed from the beam at exit electrode 233. Obviously, any neutral particles or photons initially traveling along beam axis 210 will not be influenced by the potential gradient in lens 200 at all, and will also be blocked at electrode 233.

Figure 8B:
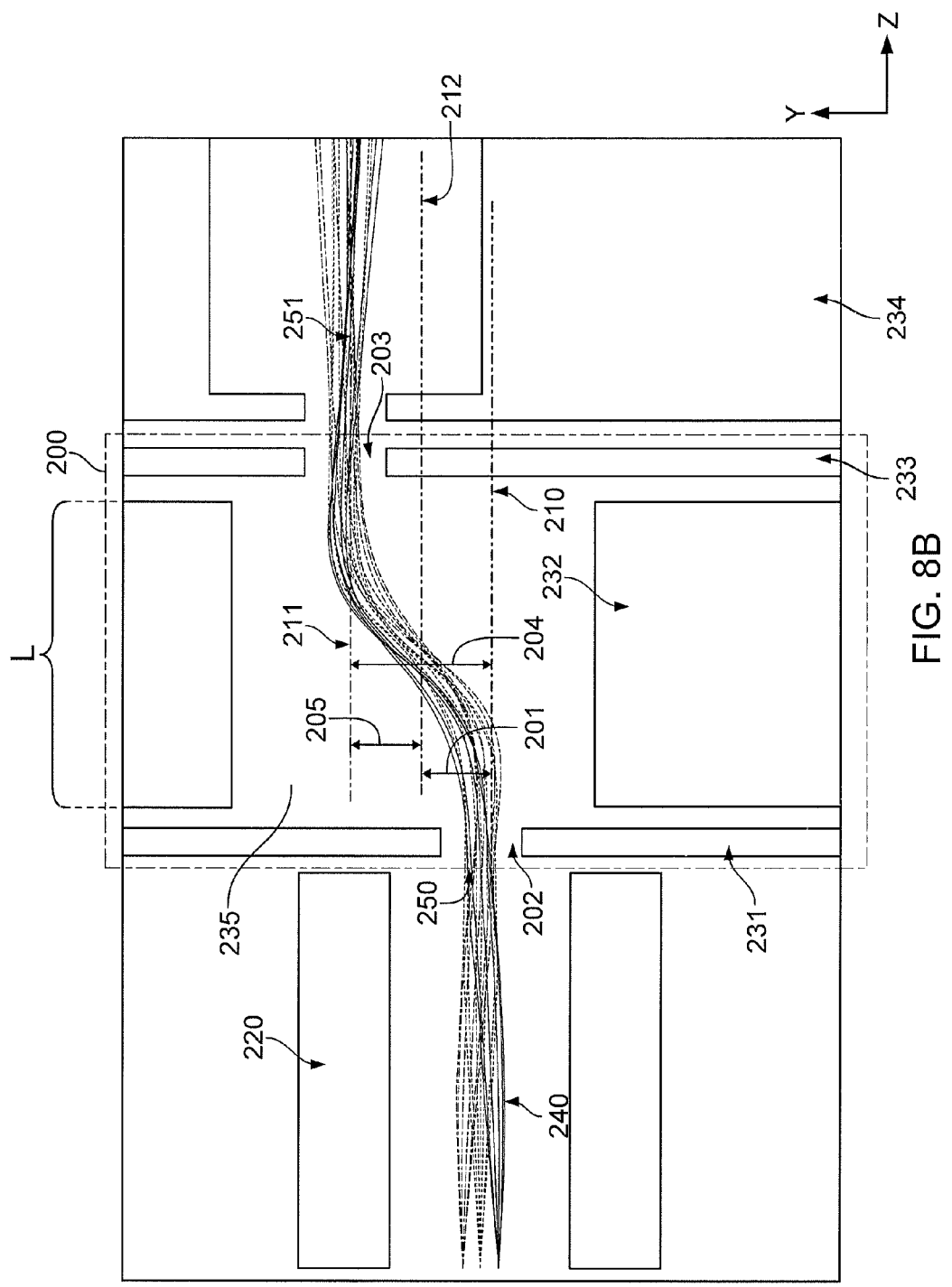
FIG. 8(b) is a cross-sectional view of the components shown in FIG. 2(a). The trajectories of the ions of FIG. 8(a) are shown for conditions different to those depicted in FIG. 8(a).

Further, it should be noted that, if the initial kinetic energies of ions within the hexapole were substantially different than 0.2 eV used in the above example, then, the voltages V1, V2, and/or V3 could be adjusted accordingly in order to optimally focus such ions. For example, if the initial (axial) kinetic energy of ions traveling through the hexapole were 10 eV, then the V2 voltage could be adjusted to 12.7 v. rather than 2.7 v., while V1=V3=−100 v., and trajectories very similar as those depicted in FIG. 2a) would result. This is demonstrated in FIG. 8(a). Alternatively, it may be desirable to adjust L1 and/or L3, which would then require re-adjustment of L2 in order to optimally focus such 10 eV ions through the lens. This is illustrated in FIG. 8(b) for ions with initial kinetic energy of 10 eV, where L1=L3=−10 v., rather than −100 v. In this case, L2 requires adjustment to 10.6 v., in order to optimally focus 10 eV ions from the hexapole.

Figure 8C:
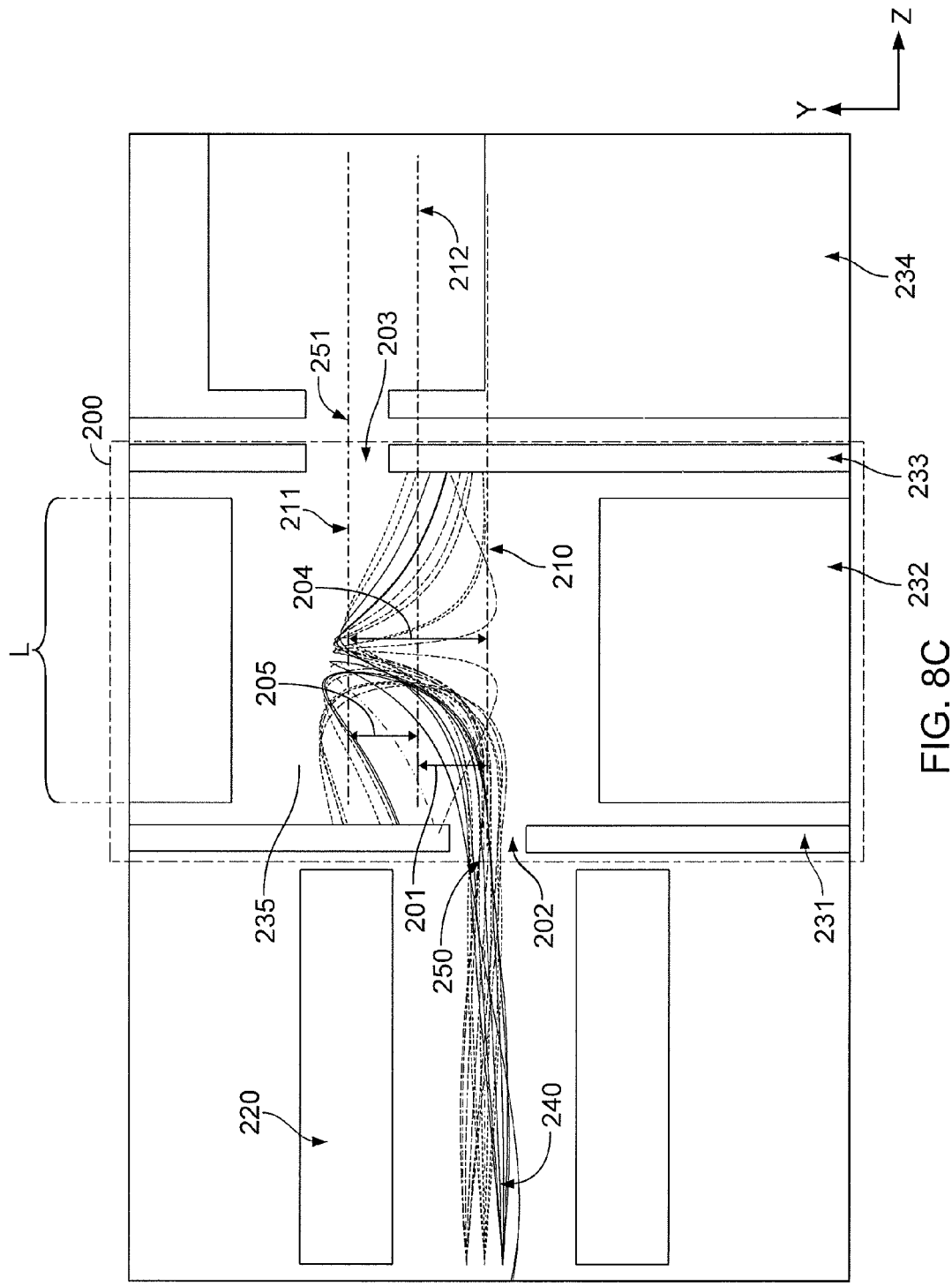
FIG. 8(c) is a cross-sectional view of the components shown in FIG. 2(a). The trajectories of ions with kinetic energies less than those of the ions shown in FIG. 8(b) are shown for conditions of FIG. 8(b).
Figure 8D:
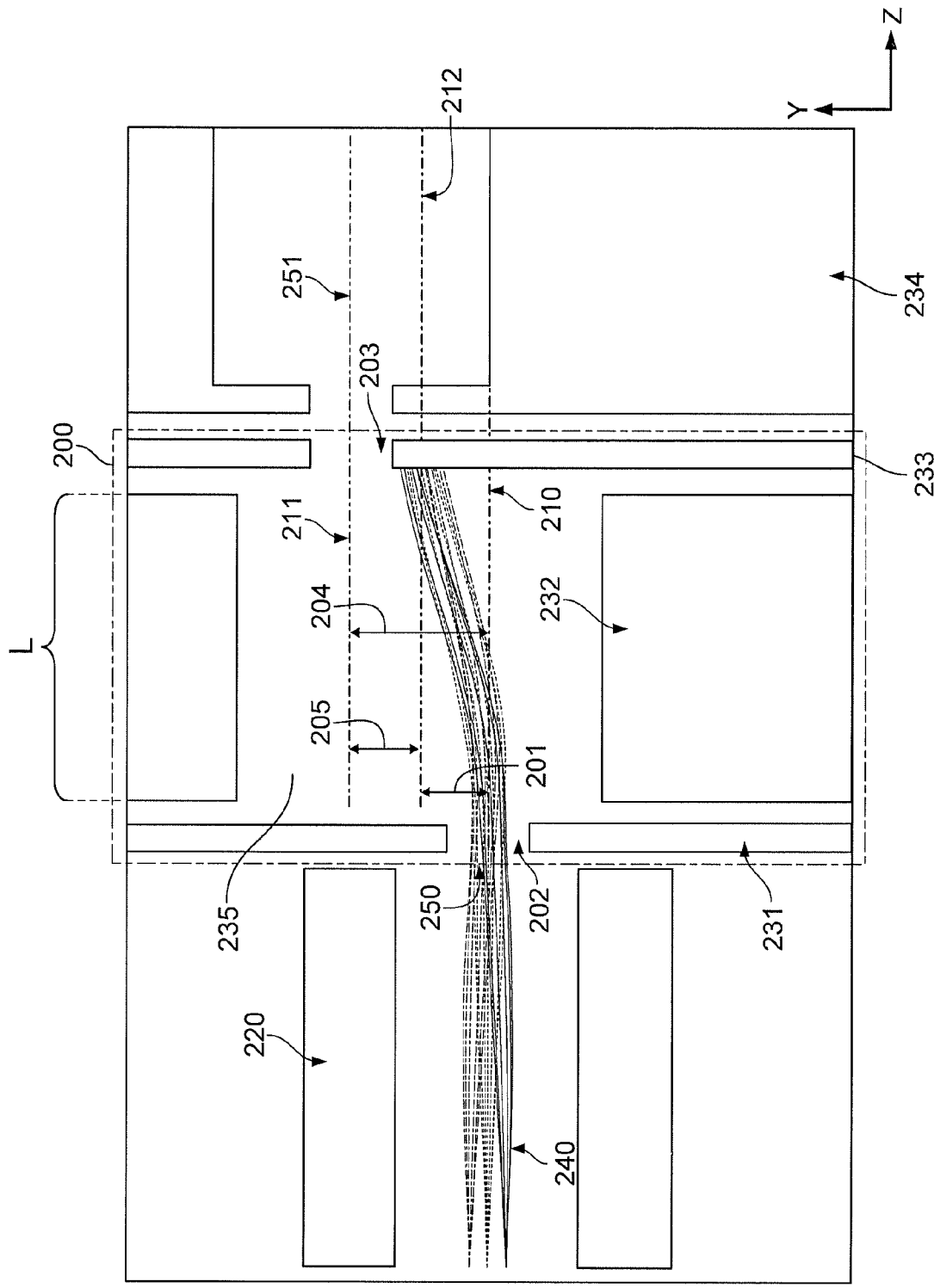
FIG. 8(d) is a cross-sectional view of the components shown in FIG. 2(a). The trajectories of ions with kinetic energies greater than those of the ions shown in FIG. 8(b) are shown for conditions of FIG. 8(b).

Ions with kinetic energies less than some lower energy cutoff, or greater than some higher energy cutoff, will not pass through the lens with the lens voltages adjusted to optimally focus 10 eV ions. For example, FIG. 8(c) illustrates the trajectories of ions with kinetic energies in the hexapole of 8.5 eV, while the lens voltages are set to those of FIG. 8(b) to pass 10 eV ions. Ions with any initial kinetic energies less than about 8.5 eV, under these operating conditions, will also fail to traverse the lens. Similarly, ions with initial kinetic energies greater than about 20 eV, as depicted in FIG. 8(d), will also fail to traverse the lens with these operating voltages. Also, while at least some ions with kinetic energies closer to 10 eV (that is, between 8.5 eV and 20 eV) may be successful in passing through aperture 203 under these operating conditions, downstream apertures may nevertheless be utilized to prevent them from continuing downstream, due to their greater angular divergence, thereby reducing the ion kinetic energy 'bandpass', if so desired. (For example, see FIG. 18 below and the related description). A similar effect can be achieved by reducing the diameter, and/or shape (for example, from a round hole to a slit) of the aperture 203.

Figure 4:
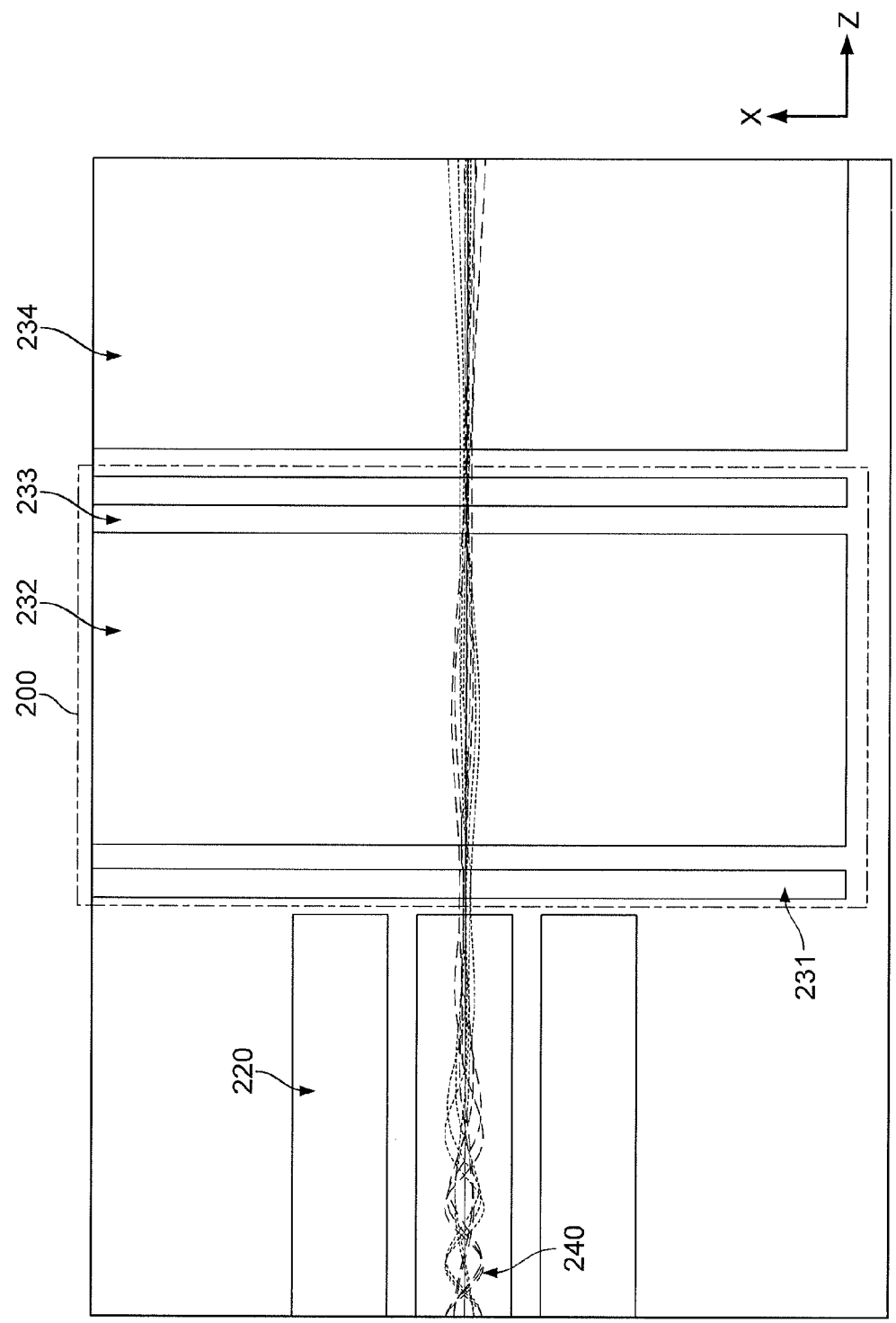
FIG. 4 is a top view of the components shown in FIG. 2(a).

Furthermore, in certain embodiments, and/or with certain operating voltages, it has been discovered unexpectedly that electrostatic lens 200 provides focusing in the x-direction in addition to the y-direction. To be clear, the ion beam axis to the right of lens 200 which coincides with the axis 211, is designated the z'-axis, and the corresponding orthogonal axes in the y- and x-directions are referred to as the y'- and x'-axes, respectively. In other words, the ion beam can be focused to a crossover in the x'-z' plane as well as in the y'-z' plane. In certain embodiments, the dimensions and voltage arrangements of the lens 200 is such that the crossover in the x'-z' plane can be positioned at more or less the same position on the z'-axis as the crossover focus in the y'-z' plane shown in FIG. 2(a). This condition reduces astigmatism in the ion beam, that is, results in focusing that is more stigmatic. Beam focusing in the orthogonal x-z plane is depicted in FIG. 4, which shows lens 200 with the same voltages and the same ion trajectories 240 as shown in FIG. 2(a), except now viewed in FIG. 4 as projected on the x'-z' plane. Focusing in the x'-z' plane as well as the y'-z' plane can improve ion transmission efficiencies through apertures 202 and 203, and accordingly through lens 200. Such focusing can also allow better performance by downstream devices, such as mass analyzers, lenses, deflectors, and the like, as is well-known in the art. However, it seems that such approximate stigmatic focusing of an ion beam that traverses an electrostatic lens via entrance and exit apertures that are not coaxial, has not previously been realized or described.

Figure 10B:
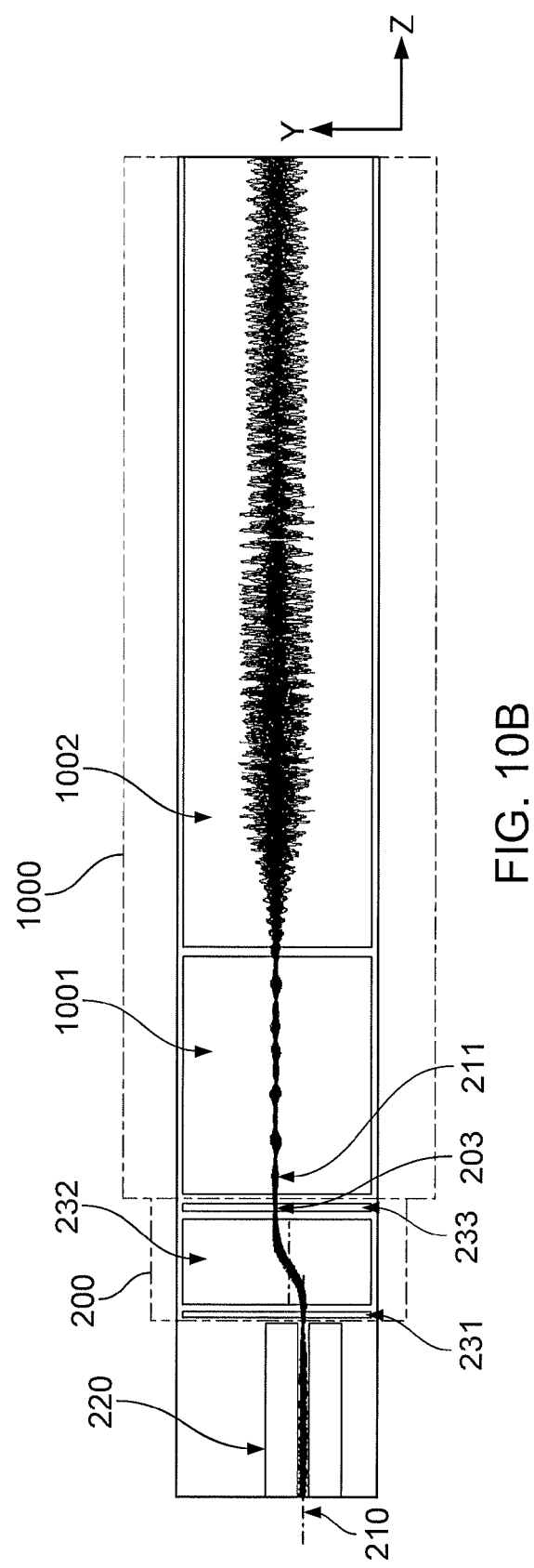
FIG. 10(b) is a side view of the components shown in FIG. 10(a). Certain ion trajectories are shown.
Figure 10C:
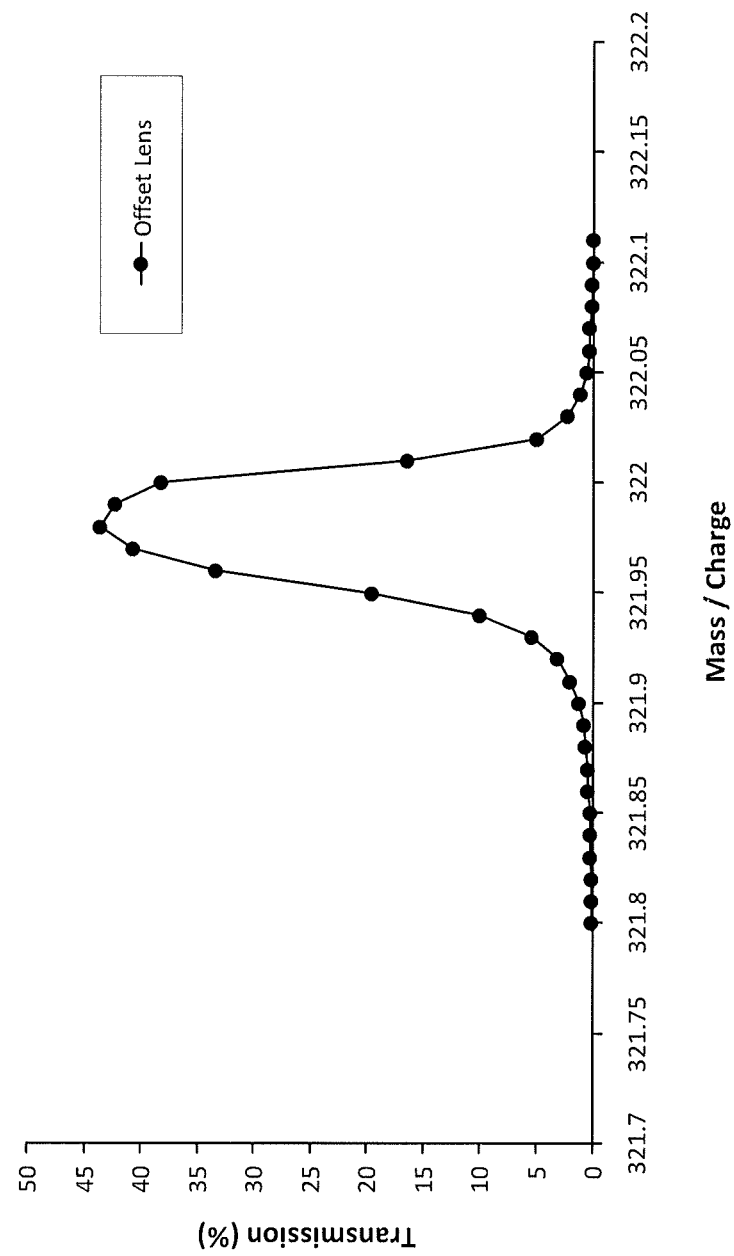
FIG. 10(c) is a plot of transmission probability of ions through the components of FIG. 10(a) as a function of the mass filter settings, corresponding to a calculated mass/charge peak in a mass spectrum.
Figure 11B:
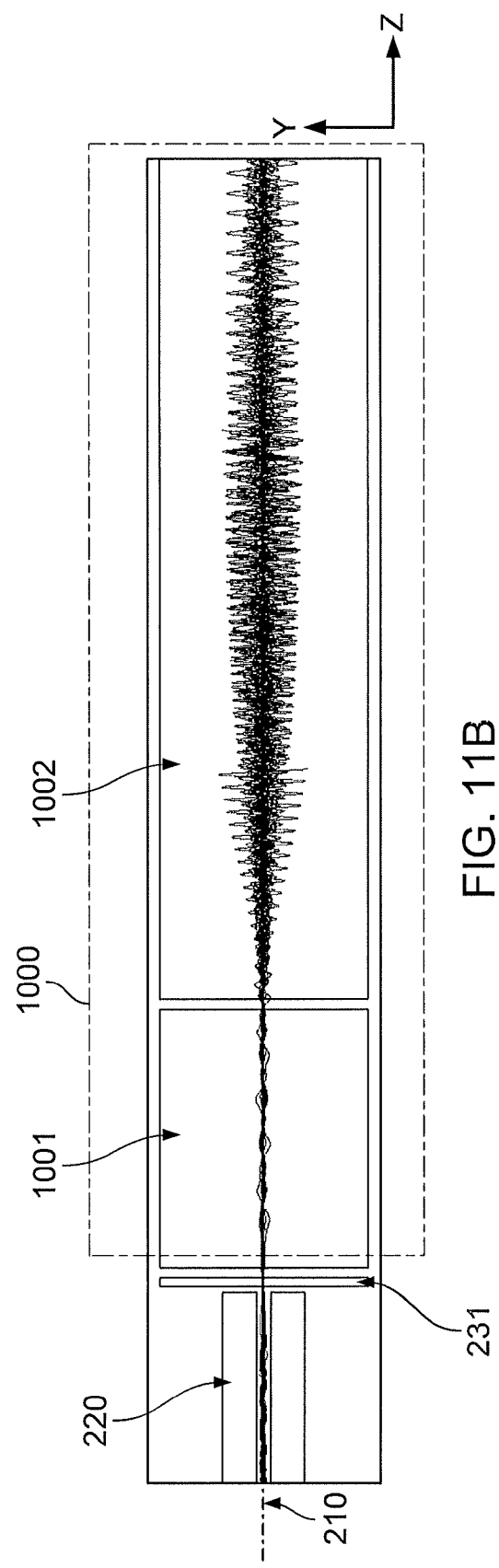
FIG. 11(b) is a side view of the components shown in FIG. 11(a). Certain ion trajectories are shown.
Figure 11C:
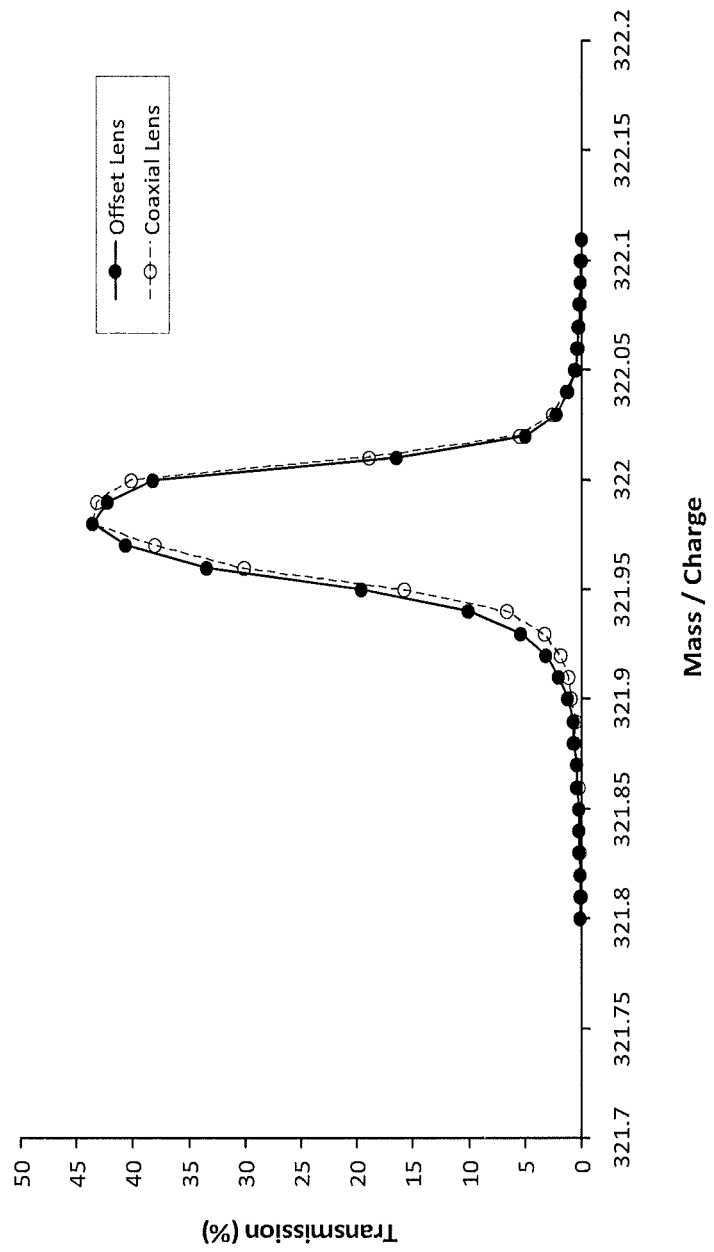
FIG. 11(c) is a plot of transmission probability of ions through the components of FIG. 11(a) as a function of the mass filter settings, corresponding to a calculated mass/charge peak. Also shown are the results plotted in FIG. 10(c) for comparison.

An example of incorporating an offset lens to transmit ions to a mass analyzer, while removing unwanted background particles, is illustrated by computer simulation models of FIGS. 10 and 11. FIG. 10(a) illustrates an embodiment comprising the hexapole ion guide 220 and offset lens 200 of FIG. 2(a), combined with a quadrupole mass filter 1000, which includes an RF-only prefilter 1001 and main quadrupole rods 1002. The prefilter 1001 is 25 mm long, the main rods 1002 are 200 mm long, and the prefilter 1001 and main rods 1002 are separated by 1 mm. Both the prefilter 1001 and main rods 1002 have ideal hyperbolic surface cross-section contours, as is well-known in the art, where the closest distance from the axis to any rod is 4.1 mm.

The RF voltage amplitude applied to the prefilter rods 1001 is assumed to be 100% of the RF voltage amplitude applied to the main rods 1002. The RF voltages applied to the prefilter rods 1001 are referenced to an adjustable prefilter offset voltage, while the RF and DC voltages applied to the main rods are referenced to an adjustable main rod offset voltage.

The potential distribution within the quadrupole mass filter 1000 was determined using the Simion 8.0 ion optics modeling package. However, prior to such calculations, the potentials of the electrode surface grid points used in the model were modified from those set by the standard Simion program, according to a method described in a co-pending U.S. application Ser. No. 12/234,954. This method allows more accurate potentials to be calculated for electrode shapes that correspond to a known analytical function, such as the electrode shapes of a hyperbolic quadrupole mass filter 1000. The improved accuracy enables the model to accurately simulate the performance of the quadrupole mass filter when operated at relatively high resolving power, which is not possibe with the conventional methods used in the standard Simion program.

FIG. 10(b) shows examples of trajectories calculated through the configuration of FIG. 10(a). Ions of mass/charge 322 are launched with 0.1 eV initial kinetic energy directed entirely in the axial direction, from an initial axial position along the hexapole ion guide 220 axis that is 19 mm upstream from electrode 231, which acts both as the exit lens of the hexapole ion guide 220, and the entrance electrode of lens 200. In this simulation, the hexapole ion guide offset voltage was 20 v.; the voltage V1 and V3 applied to the electrode 231 and 233, respectively, was −80 v. for both; the voltage applied to the central electrode 232 of the lens 200 was 22.7 v.; the voltage applied to the offset of the quadrupole prefilter 1001 was 11.75 v; and the offset voltage applied to the quadrupole main rods was 19.0 v. It should be clear that the voltage gradients, that is, the electric field distributions, in the hexapole ion guide 220 and lens 200 are identical to the potential gradients described previously in relation to the trajectory calculations shown in FIG. 2(a), so the focusing characteristics should be essentially the same.

For each ion trajectory calculation, the initial radial position of an ion was defined to be random within a beam diameter in the hexapole of 0.82 mm, centered on the hexapole axis 210. The peak RF voltage amplitude applied to the hexapole was 400 v. (0 to peak) at a frequency of 4.0 MHz, while the frequency of the quadrupole mass filter RF voltage was 1.0 MHz. A set of 100 such ions were launched for each of 10 initial RF phases of the hexapole RF voltage, and for each of 10 RF phases of the quadrupole mass filter RF voltage, where the RF and DC voltages of the quadrupole mass filter 1000 were tuned to pass a particular mass/charge value ion. Therefore, the trajectories of a total of 10,000 ions of mass/charge 322 were calculated for each particular tune mass/charge value of the quadrupole mass filter 1000. The transmission and resolving power of the quadrupole mass filter 1000 were evaluated by performing such trajectory calculations for each tune setting of the quadrupole mass filter 1000 for tune mass/charge values from 321.8 to 322.1, the tune mass/charge value being incremented by 0.01. For these calculations, the RF and DC voltages applied to the quadrupole mass filter 1000 were adjusted to provide a resolving power of approximately 5400, for an ideal quadrupole mass filter, which corresponds to a theoretical low-mass/charge stability limit of approximately 321.95 and a high-mass/charge stability limit of 322.01. A successful 'transmission' of any ion required that the ion successfully traversed the quadrupole mass filter 1000 to a distance of about 200 mm measured from the start of the main rod section 1002.

The results of such transmission calculations are shown in FIG. 10(*c*). The maximum transmission was determined to be about 43%, and the width of the peak corresponds closely to the stability limits expected for an ideal quadrupole mass filter. As expected, some ions are transmitted successfully outside these stability limits, giving rise to the 'tails' of the peak shape, primarily because these ions experience an insufficient number of cycles of the RF voltage to be filtered out, due to the assumed finite length of the quadrupole mass filter 1002 of 200 mm. Also, the peak transmission within the stable region is less than 100% primarily because the finite aperture radius of the quadrupole mass filter 1002 of 4.1 mm limits the maximum amplitude of ion oscillation, even for otherwise 'stable' ions, within the quadrupole mass filter 1002 structure.

In order to evaluate whether the offset lens 200 affected the performance of the quadrupole mass filter 1000, a similar set of calculations were performed using the configuration geometry shown in FIG. 11(*a*). The geometry shown in FIG. 11(*a*) incorporates the same hexapole ion guide 220, and the same quadrupole mass filter 1000, as the configuration of FIG. 10(*a*). However, the hexapole ion guide axis and the quadrupole mass filter axis now coincide as axis 1210 in FIG. 11(*a*), and the lens 200 of FIG. 10(*a*) was replaced by interface electrode 1231, having 2 mm aperture 1202. Electrode 1231 in FIG. 11(*a*) is positioned so that the axis of aperture 1202 coincides with axis 1210; the separation between electrode 1231 from the end of ion guide 220 is the same as that of electrode 231 in FIG. 10(*a*); and the separation between electrode 1231 and the entrance end of quadrupole prefilter 1001 is the same as that of electrode 233 in FIG. 10(*a*). Also, the potential applied to electrode 1231 is −80 v., the same potential as was applied to electrodes 231 and 233 of FIG. 10(*a*).

Exemplary trajectories calculated through the configuration of FIG. 11(*a*) are shown in FIG. 11(*b*). The resulting mass/charge peak profile calculated in the same manner as that of FIG. 10(*c*) is shown in FIG. 11(*c*), along with the peak profile that was shown in FIG. 10(*c*). It is apparent that the transmission characteristics of the configuration of FIG. 11(*a*), which does not include an offset lens, are essentially the same as that of the configuration of FIG. 10(*a*) which does include an offset lens. Hence, the focusing and transmission characteristics of electrostatic offset lens 200 is demonstrated to provide a means to occlude unwanted background particles such as energetic aerosol particles, by virtue of the offset entrance and exit axes of the lens, without significantly degrading the optical quality of the beam of desired ions.

In general, the displacement of the beam axis from axis 210 at entrance aperture 202 to axis 211 at exit aperture 203 depends on: the nominal kinetic energy of ions as they enter entrance aperture 202; the potential difference between electrode 231 and 232; the potential difference between electrode 232 and 233; the length L of hole/bore 235; the cross-sectional shapes and dimensions of apertures 202, 203, and hole/bore 235; the spacings between the central electrode 232 and either end electrodes 231 and 233; and the relative offsets 201, 205, and 204. In general, many combinations of dimensions and voltages will prove to be acceptable, depending partly on the incoming beam kinetic energy, the desired final focusing characteristics, and the space available for accommodating the lens structure.

In some embodiments, it is advantageous that the beam axis downstream of the lens be parallel to the beam axis upstream of the lens, and that the lens be configured as a so-called electrically-symmetric 'Einzel' lens, where the potentials on the entrance electrode and exit electrode of the lens are at the same potential; these are typically held constant during operation, while the potential of the center electrode is the single ('Tinzel') adjustable potential, which is adjusted to achieve the desired focusing characteristics. In the embodiments described herein, the potential that may be applied to the center electrode, such as electrode 232 in FIG. 2(*a*), will not be a freely adjustable parameter, as only one potential will provide parallel entrance and exit beam axes, that is, for a beam having a particular incoming kinetic energy and for a fixed combination of potentials applied to all other electrodes. This means the focusing properties of such a lens is determined entirely by the geometry of the lens, for a given beam energy.

The dimensions of the lens geometry that are more important in this regard include the length and hole/bore/hole diameter/cross-section shape of the central electrode 232. Conventionally, in order to configure an ion optical arrangement that includes an electrostatic lens, it is generally useful to know how the optical properties of such lenses vary with such dimensions. Specifically, as in the field of light optics, it is well-known in the field of electrostatic optics that it is most useful to know how a lens functions in the so-called 'paraxial' approximation, that is, under conditions where the distances and angular deviations of trajectories from the beam axis are small. Within this approximation, the optical focusing properties of a lens may be characterized by the so-called 'cardinal points' of the lens. Of particular interest here are the 'projective cardinal points', specifically, the 'projective principal points' and 'projective focal points' of a lens. A 'focal point' is the location of the image that the lens forms of a beam in which all incoming trajectories are parallel to the beam axis. In many embodiments described herein, ion trajectories often cross the axis inside the lens, so it will prove most useful to consider the 'projective focal point', which is the axial point on the outgoing beam axis at which the projections of the outgoing trajectories forms the image of an incoming parallel beam.

A 'principal point' is the location on the beam axis where the 'principal plane' intersects the beam axis, where the 'principal plane' is the plane normal to the beam axis in which incoming trajectories and outgoing trajectories intersect. Similarly, discussion will be limited to the 'projective' principal points and planes, which describe the plane and corresponding point where the projections of the incoming and outgoing trajectories intersect.

Because the embodiments described herein do not exhibit cylindrical symmetry, the cardinal points characterizing a lens in the y-z plane, as defined in FIG. 2(*a*), will be different, in general, from those characterizing a lens in the orthogonal x-z plane, and so separate sets of cardinal points must be specified for these two orthogonal planes. Additionally, the traditional definition of such cardinal points, as described above, assume the beam axes of the incoming and outgoing trajectories, respectively, coincide. This is not the case for the lenses described herein. However, for embodiments in which the incoming and outgoing beam axes are parallel, but offset by a certain distance such as the distance 204 in FIG. 2(*a*), it is nevertheless possible to specify projective cardinal points for such embodiments by simply accounting for the offset distance before constructing the trajectory projections. Then, the axis of the incoming ion beam and that of the outgoing ion beam may be considered to be different sections of the same axis.

Figure 9A:
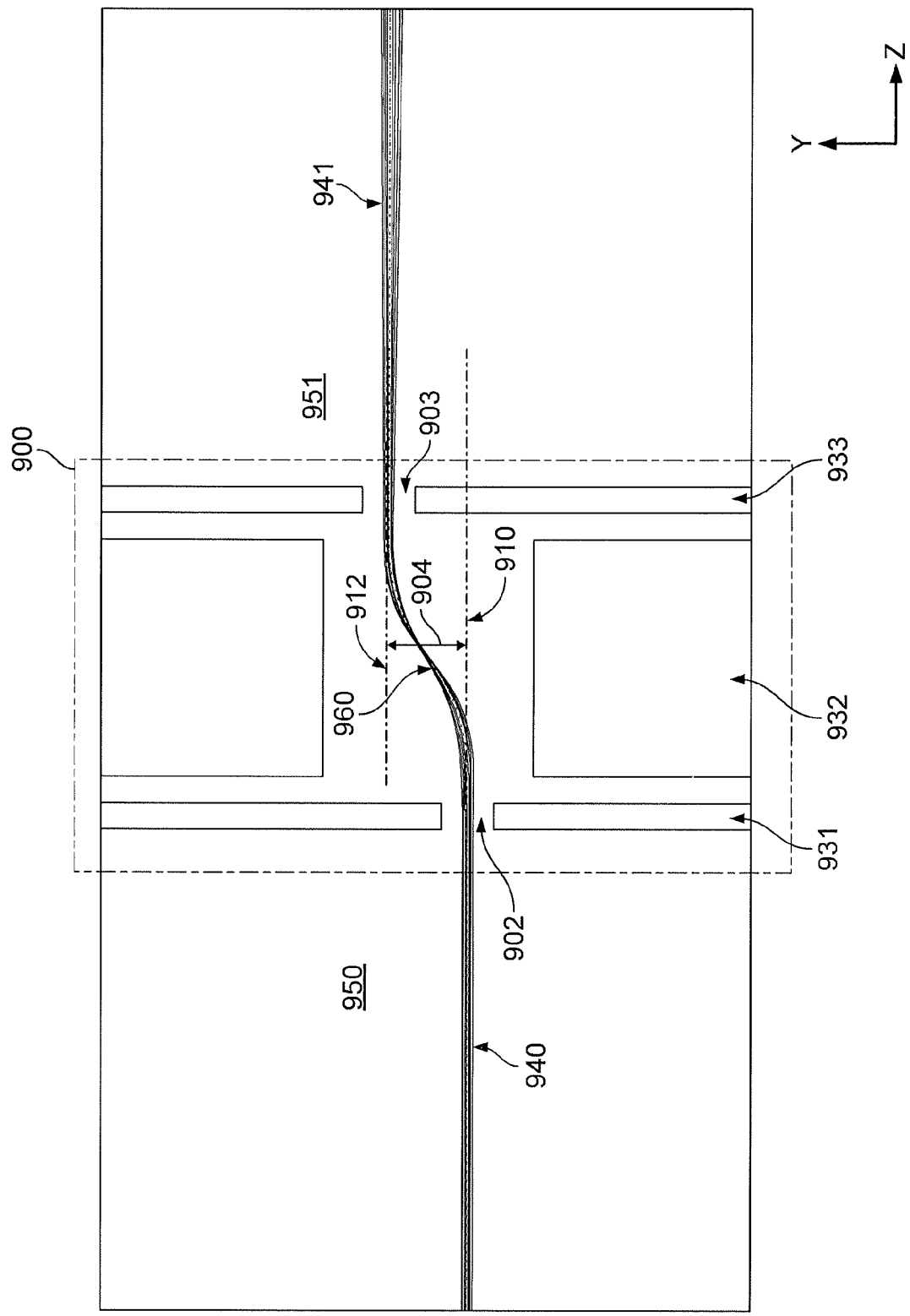
FIG. 9(a) is a cross-sectional view of the lens shown in FIG. 2(a). Certain trajectories are shown for conditions where the axis of the transmitted trajectories is parallel to the axis of the incident trajectories.
Figure 9B:
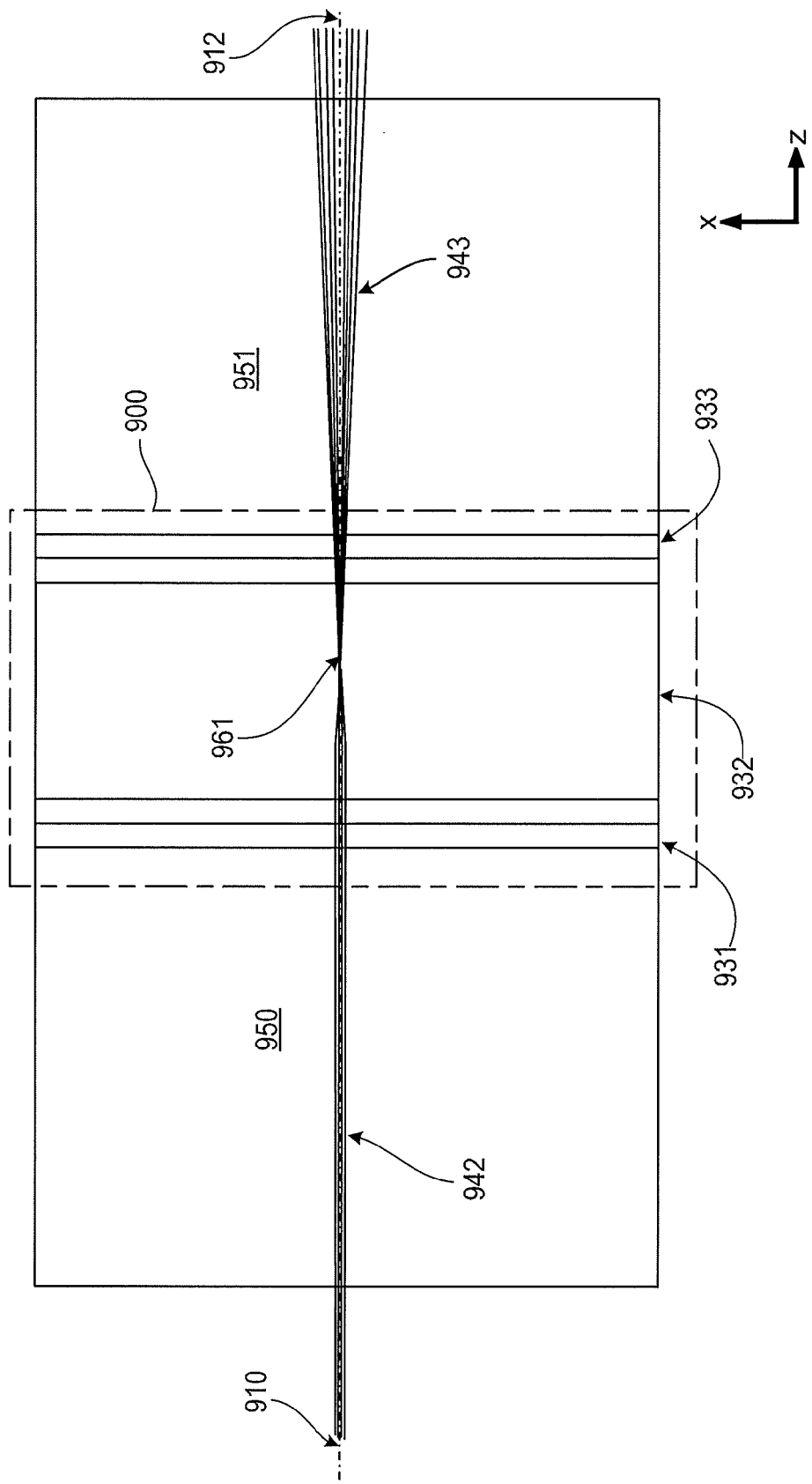
FIG. 9(b) is a top view of the components and trajectories shown in FIG. 9(a).

For example, the projective cardinal points of the lens embodiment of FIG. 2(*a*) is determined as follows: As shown in FIG. 9(*a*), a lens 900, identical to lens 200 of FIG. 2(*a*), was configured in a computer model without any other component. The potentials on both the entrance electrode 931 and exit electrode 933 were fixed at 0 v., and the regions 950 and 951 outside the lens 900 were essentially field-free at a potential of 0 v. Trajectories were calculated for an initial parallel beam of ions 940 having an incoming kinetic energy of 100 eV. This kinetic energy is close to the kinetic energy of ions 240 of FIG. 2(*a*) as the ions pass through the lens entrance aperture 202 (being accelerated between the hexapole ion guide offset voltage of 20 v., and the entrance electrode 231 potential of −80 v.). The exit aperture 903 was offset from the entrance aperture 902 by a distance 904 of 3 mm, as for the lens 200 of FIG. 2(*a*). Ion trajectories 940 displayed in FIG. 9(*a*) were started over a range in the y-z plane from −0.2 mm to 0.2 mm from the beam axis 910.

In order that the outgoing beam axis be parallel with the incoming beam axis, it was determined that the potential applied to the central focus electrode 932 was required to be 101.136 v. This potential was determined by adjusting the potential of electrode 932 until an incoming trajectory coincident with entrance electrode 931 axis 910 passed through the lens through exit aperture 903 of exit electrode 933, and proceeded downstream along a trajectory that was parallel to the incoming trajectory, essentially along axis 912 of exit aperture 903. It is apparent from inspection of the calculated incoming trajectories 940 in FIG. 9(*a*) that a beam focus 960 occurs within the lens 900, and a mildly divergent beam 941 is produced upon exiting the lens 900, that is, for this particular lens, and for an incoming beam with ion trajectories 940 parallel to axis 912.

The projected principal plane of this lens was determined by finding the axial position at which the projection of the incoming portion of a trajectory intersects the projection of the outgoing portion of the trajectory, after subtracting the offset distance in the y-direction between the incoming and outgoing portions. The trajectories in FIG. 9(*a*) that are started closest to the axis in the simulation have starting positions of +/−0.05 mm from the axis in the y-direction. In the exit region 951, these trajectories have slopes with respect to the exit axis 912 of −0.0036 and 0.0030, respectively. For an ideal, axisymmetric (that is, cylindrically symmetric) lens, these slopes would be equal but opposite in sign. The difference in their magnitude probably reflects the fact that the optical axis along the beam path within the lens is curved, resulting in an effective principal plane that is not strictly orthogonal to the beam axes 910 and 912 outside the lens, nor is it even strictly planar. However, this distortion becomes progressively smaller as the starting positions become closer to the axis 910. In any case, the position of the projective principal plane, or, more precisely, the projective principal point, can be estimated by averaging the positions of the projective principal points derived from these two trajectories. For this example, axial positions are referred to the lens geometrical mid-point, which, therefore, is taken as the '0' of the z-axis and z'-axis. In order to derive the position of the projective principal point for either trajectory, the y and z coordinates of one point along the outgoing trajectory is required, as well. For this example, a point on the outgoing trajectory at z'=50 mm was chosen, where it was found that the y-distance from the beam axis was 0.18 mm for the trajectory starting −0.05 mm from the beam axis, and −0.20 mm for the trajectory starting 0.05 mm from the beam axis. From simple geometrical considerations, the projection of these outgoing trajectories are found to intersect the respective incoming trajectories (that is, after subtracting the offset distance 904) at z=−26.5 mm and −20.3 mm, respectively, relative to the lens mid-point, which are, therefore, the respective positions of the projective principal points in the y-z plane of the lens 900. For comparison purposes, the average of these two values, that is, z=−23.4 will be taken as the approximate position of the projective principal point of lens 900 in this plane.

The location of the projective focal point in this y-z plane may be determined similarly by determining the z-axis location where the back-projections of the outgoing trajectories 941 intersect the beam axis 912. For the trajectory with starting y-position of −0.05 mm, the projective focal point was found to be at z=−9.65 mm, while the projective focal point for the trajectory with starting y-position of 0.05 mm was found to be −6.44 mm. Again, the average of these two values of z=−8.04 mm will be taken as the approximate position of the projective focal point of lens 900 in this y-z plane for comparison purposes. Since these focal points are measured relative to the lens axial mid-point, they are typically referred to as the 'mid-focal' lengths.

Ion trajectories calculated for starting positions in the orthogonal x-z plane of the lens 900 are shown as they would be projected on to the x-z plane in FIG. 9(*b*). Trajectories were calculated for an initial parallel beam of ions 942 having a kinetic energy of 100 eV, using the same potentials applied to the lens 900 electrodes 931, 932, and 933 as for the calculations of FIG. 9(*a*). Ion trajectories were started parallel to the incoming beam axis 910 over a range in the x-z plane from x=−0.2 mm to x=0.2 mm. From the trajectories started +/−0.05 mm from the beam axis 910 in the x-z plane, it was determined, as discussed above, that the principal point in this plane was located at a z-axis position of z=−4.0 mm from the mid-point of the lens 900 for each of these trajectories. Similarly, it was determined that the projective principal point in the x-z plane was located at z=1.78 mm from the lens mid-point.

Since the lens 900 has projective mid-focal points at significantly different axial locations, that is, at z=−8.04 mm in the y-z plane, vs. z=1.78 mm as projected onto the x-z plane (or, equivalently, the x'-z' plane), this means that the embodiment of lens 900 creates an astigmatic image, at least for an incoming ion beam having a kinetic energy of 100 eV. Such astigmatism apparently has very little effect on the performance of a quadrupole mass filter as was demonstrated above with the equivalent lens 200 of FIG. 2(*a*). However, astigmatism can become more problematic when electrostatic lenses are deployed in optical assemblies intended to produce a finely-focused beam, or when focusing a beam through a small aperture, as in an energy filter or analyzer, while maximizing transmission.

Figure 12:
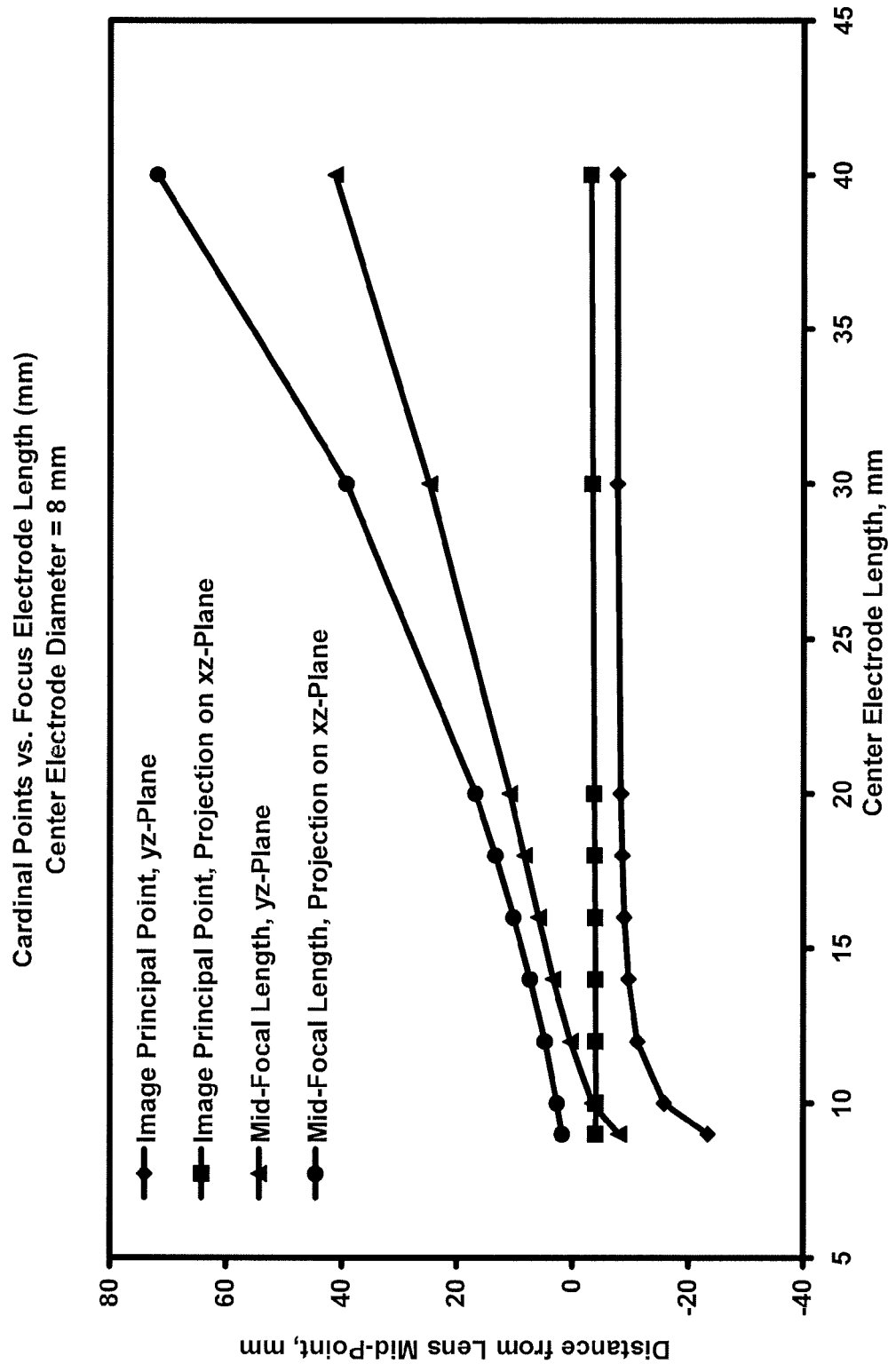
FIG. 12 is a plot of calculated lens parameters for the lens of FIG. 9(a) as a function of the center electrode length, for a cylindrical center electrode inner diamater of 8 mm.

It was found through additional similar simulations and analysis that one way to reduce the separation between the projective mid-focal lengths in the y-z plane (the "y-z mid-focal length") and as projected onto the x-z planes (the "x-z mid-focal length"), and thereby reduce astigmatism, is by lengthening the lens, that is, by lengthening the central electrode 932. FIG. 12 is a plot of results of similar calculations as described above for the lens of FIG. 9, where the diameter of the center electrode 932 was held constant at 8 mm, while its length was incremented from 9 mm to 40 mm (other lens dimensions being the same as for FIG. 9), and the optical properties were evaluated as above for each length. It is apparent from FIG. 12 that, for this 8 mm center electrode diameter, a center electrode length of approximately 14 mm results in a minimum separation between the y-z and x-z mid-focal lengths, which was found to be approximately 3.9 mm. This separation is a significant improvement over the approximately 9.8 mm separation for the lens of FIG. 9.

Figure 13:
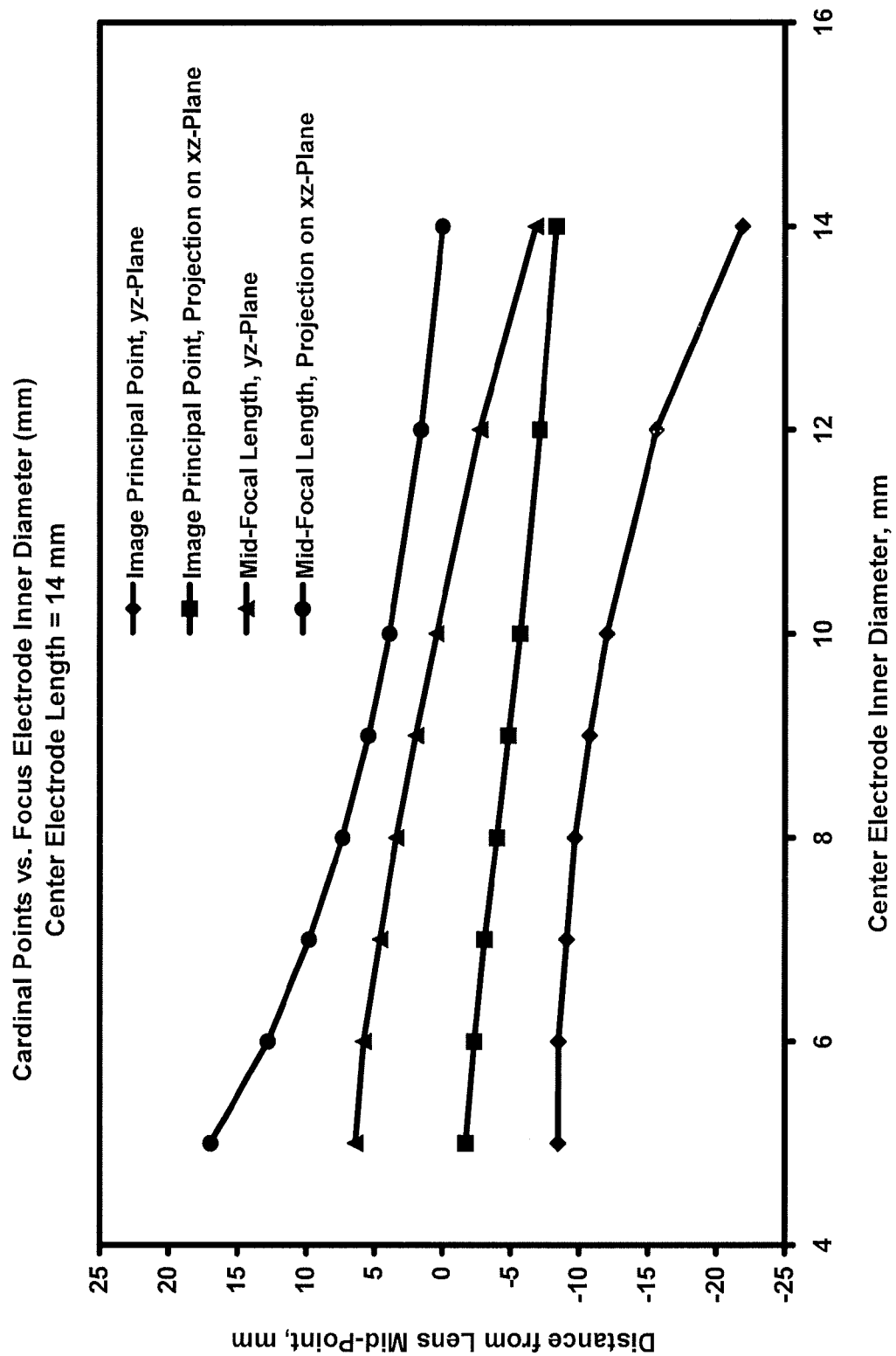
FIG. 13 is a plot of calculated lens parameters for the lens of FIG. 9(a) as a function of the center electrode inner diameter, for a cylindrical center electrode length of 14 mm.

It was also found through similar calculations that the separation between the y-z and x-z mid-focal lengths could be reduced further by adjusting the center electrode diameter as well. FIG. 13 is a plot of results for a lens as shown in FIG. 9, but with center electrode length of 14 mm, and where the center electrode inner diameter was incremented from 5 mm to 14 mm, keeping other lens dimensions fixed. It was found that a minimum separation between the y-z and x-z mid-focal lengths can be realized with an inner diameter of approximately 10 mm for this 14 mm center electrode length, for which the separation between the y-z and x-z mid-focal lengths was found to be 3.4 mm.

Figure 14:
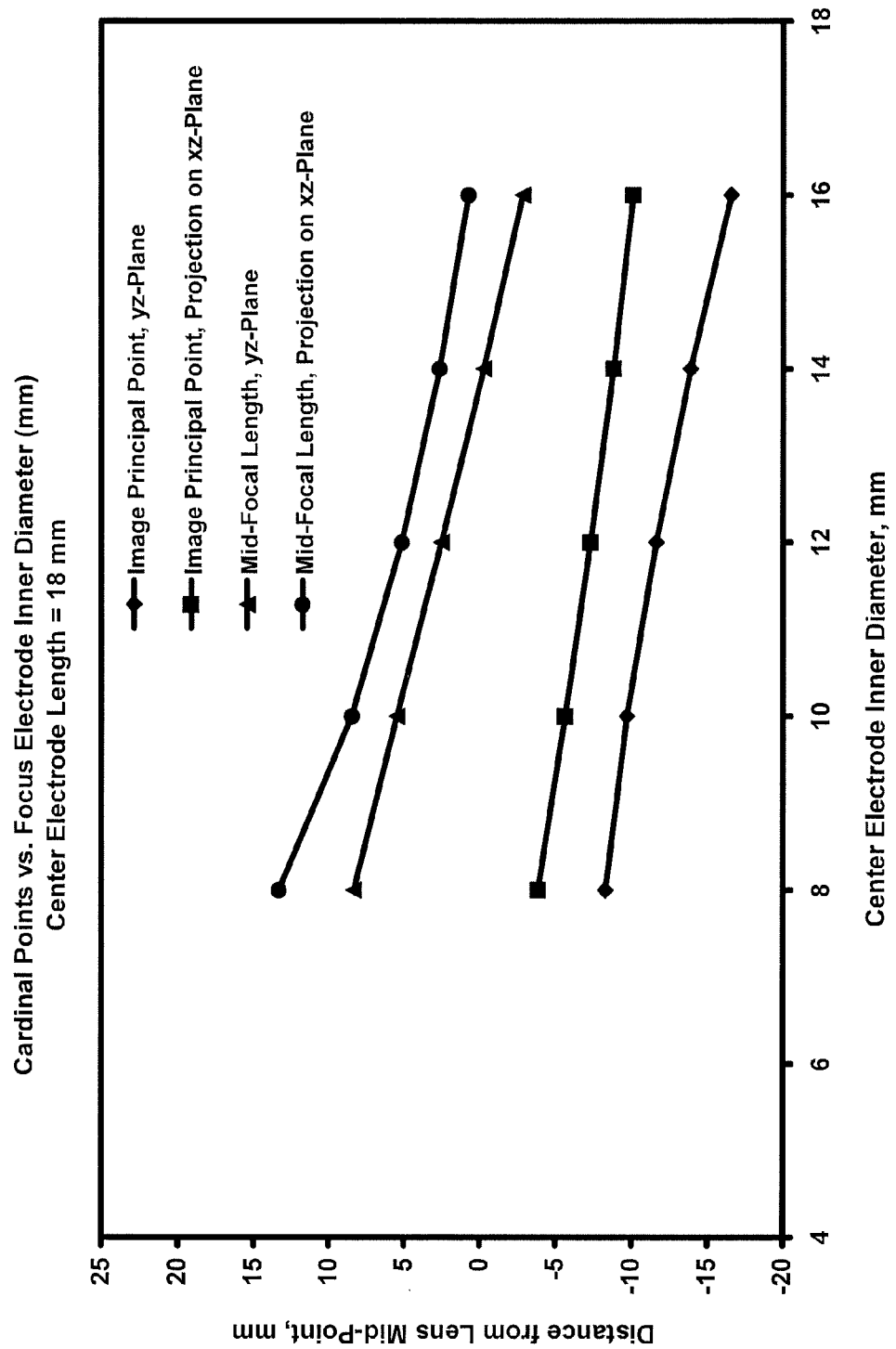
FIG. 14 is a plot of calculated lens parameters for the lens of FIG. 9(a) as a function of the center electrode inner diameter, for a cylindrical center electrode length of 18 mm.
Figure 15:
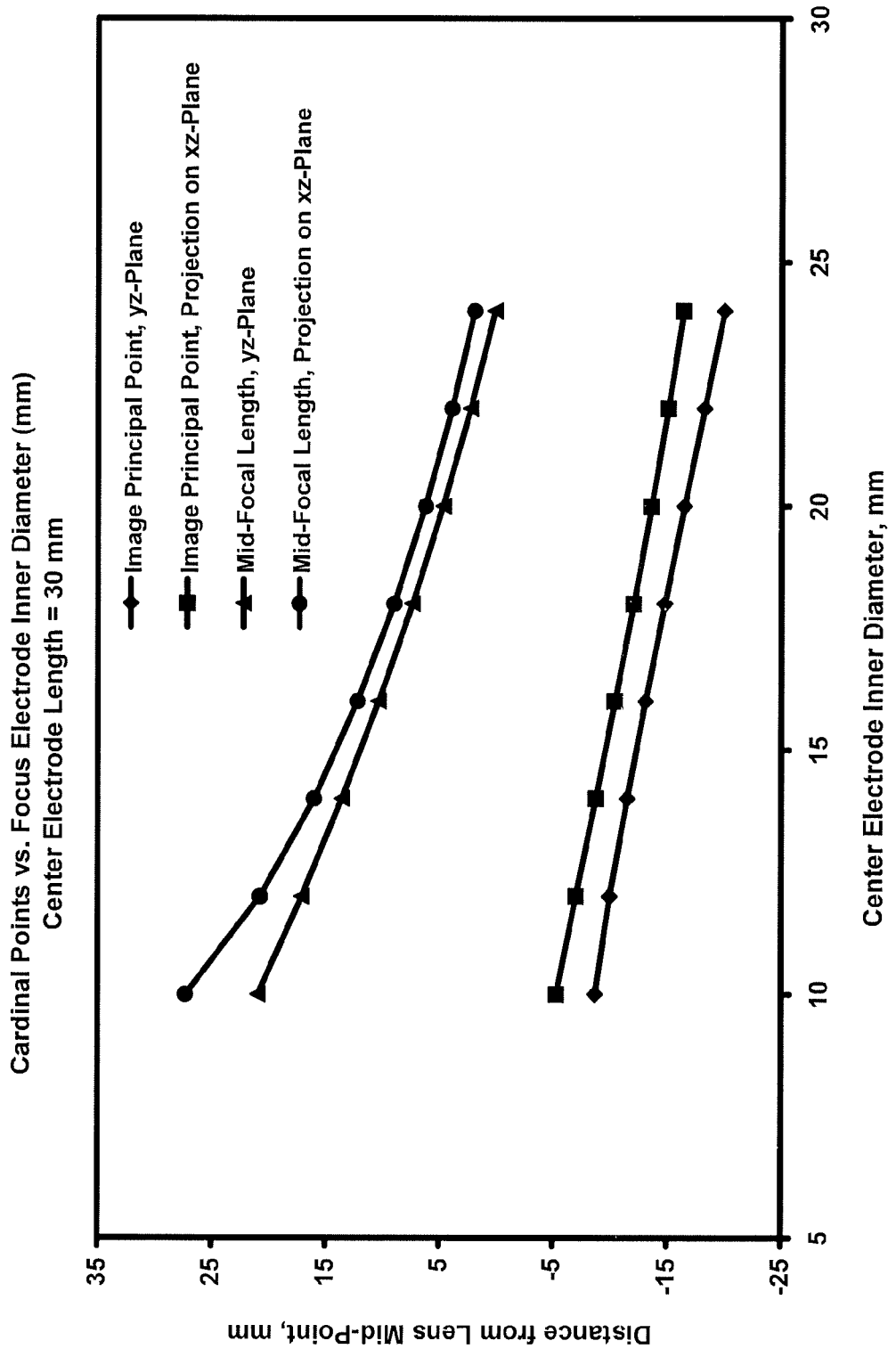
FIG. 15 is a plot of calculated lens parameters for the lens of FIG. 9(a) as a function of the center electrode inner diameter, for a cylindrical center electrode length of 30 mm.

FIGS. 14 and 15 show results of similar calculations for a center electrode length of 18 mm and 30 mm, respectively. The minimum separation between the y-z and x-z mid-focal lengths with the 18 mm length was found to be approximately 2.6 mm for a center electrode diameter of 12 mm, while that for the 30 mm length was found to be approximately 1.6 mm for a center electrode diameter of 20 mm.

From the results of FIGS. 13, 14 and 15, it appears that the minimum separation between the y-z and x-z mid-focal lengths decreases as the center electrode length increases, with all other lens dimensions remaining the same. It also appears that the minimum separation between the y-z and x-z mid-focal lengths result when the center electrode length is approximately 1.5× its diameter. However, it would seem that the minimum separation between the y-z and x-z mid-focal lengths remains greater than zero for the range of center electrode lengths investigated here, which implies that astigmatism is present, at least to some extent, when a round center electrode hole/bore is used with these dimensions. Again, the amount of astigmatism that may be tolerated without degrading performance will depend on the requirements of a given application.

Figure 16A:
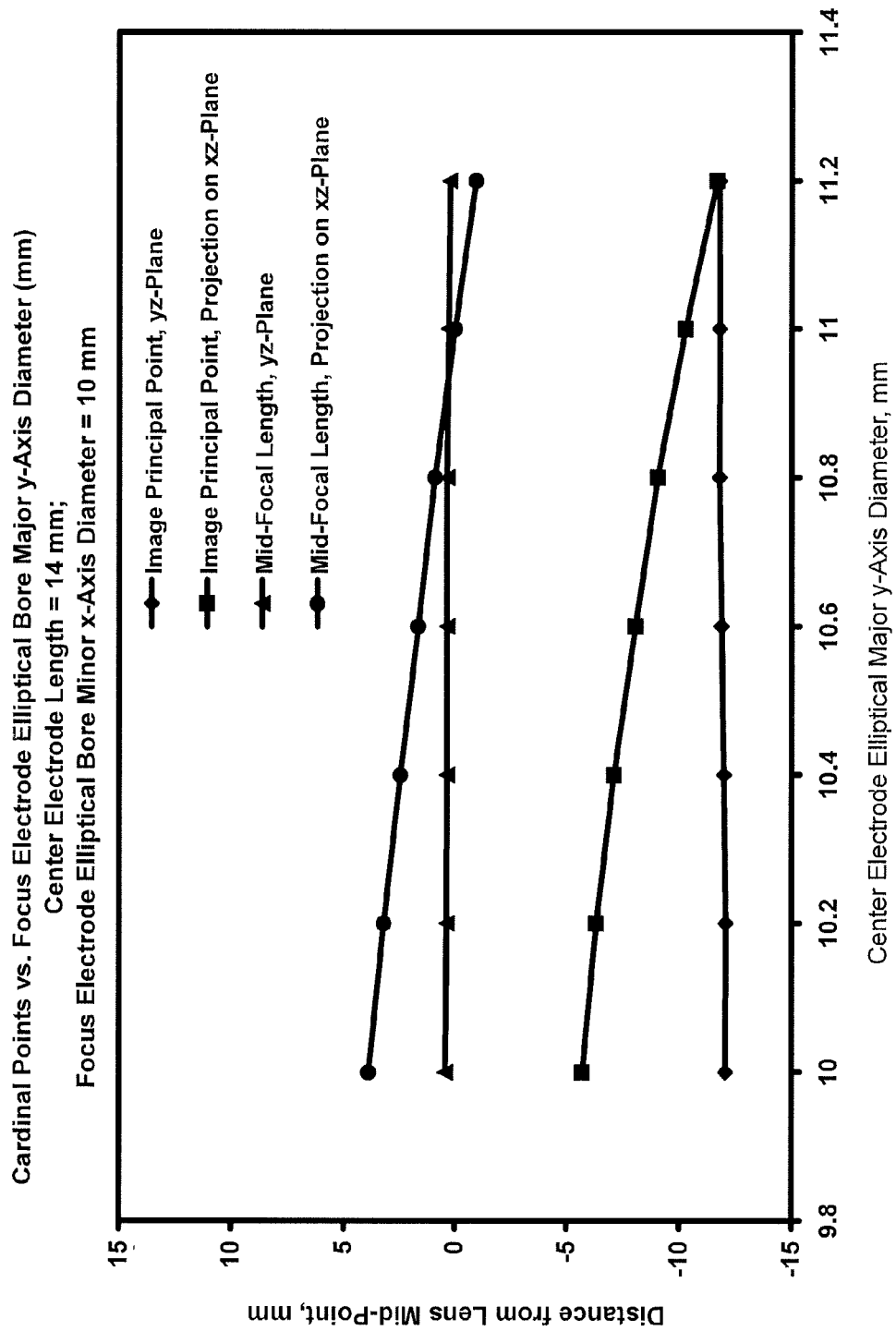
FIG. 16(a) is a plot of calculated lens parameters for the lens of FIG. 9(a) for an elliptical center electrode length of 14 mm and an elliptical minor axis diameter in the lens x-axis direction of 10 mm, as a function of the elliptical major axis diameter in the lens y-axis direction.

However, it was discovered that the separation between the y-z and x-z mid-focal lengths could be reduced essentially to 0, thereby essentially eliminating astigmatism, by allowing the cross-sectional shape of the center electrode hole/bore to deviate from a round cylinder, that is, by allowing the dimension of the hole/bore in the lens y-direction to be different from that in the lens x-direction. For example, the lens of FIG. 13, having a center electrode length of 14 mm, was configured with an elliptical shape for the center electrode hole/bore, where the lengths of the major and minor axes were adjusted. The results of these calculations are shown in FIGS. 16(a), 16(b), 16(c), and 16(d). FIG. 16(a) shows results in which the elliptical hole/bore minor axis was oriented along the lens x-axis direction and held constant at 10 mm, and where the elliptical hole/bore major axis was oriented along the lens y-axis direction, and varied from 10 mm to 11.2 mm, while keeping the mid-plane of the hole/bore in the y-direction fixed at half-way between the incoming beam and lens entrance aperture axis, and the outgoing beam and lens exit aperture axis. It is apparent that the separation between the y-z and x-z mid-focal lengths coincides for a center hole/bore elliptical major axis dimension of approximately 10.9 mm, implying that beam astigmatism is negligible for these lens dimensions and potentials, and for an incoming parallel beam of 100 eV ions.

Figure 16B:
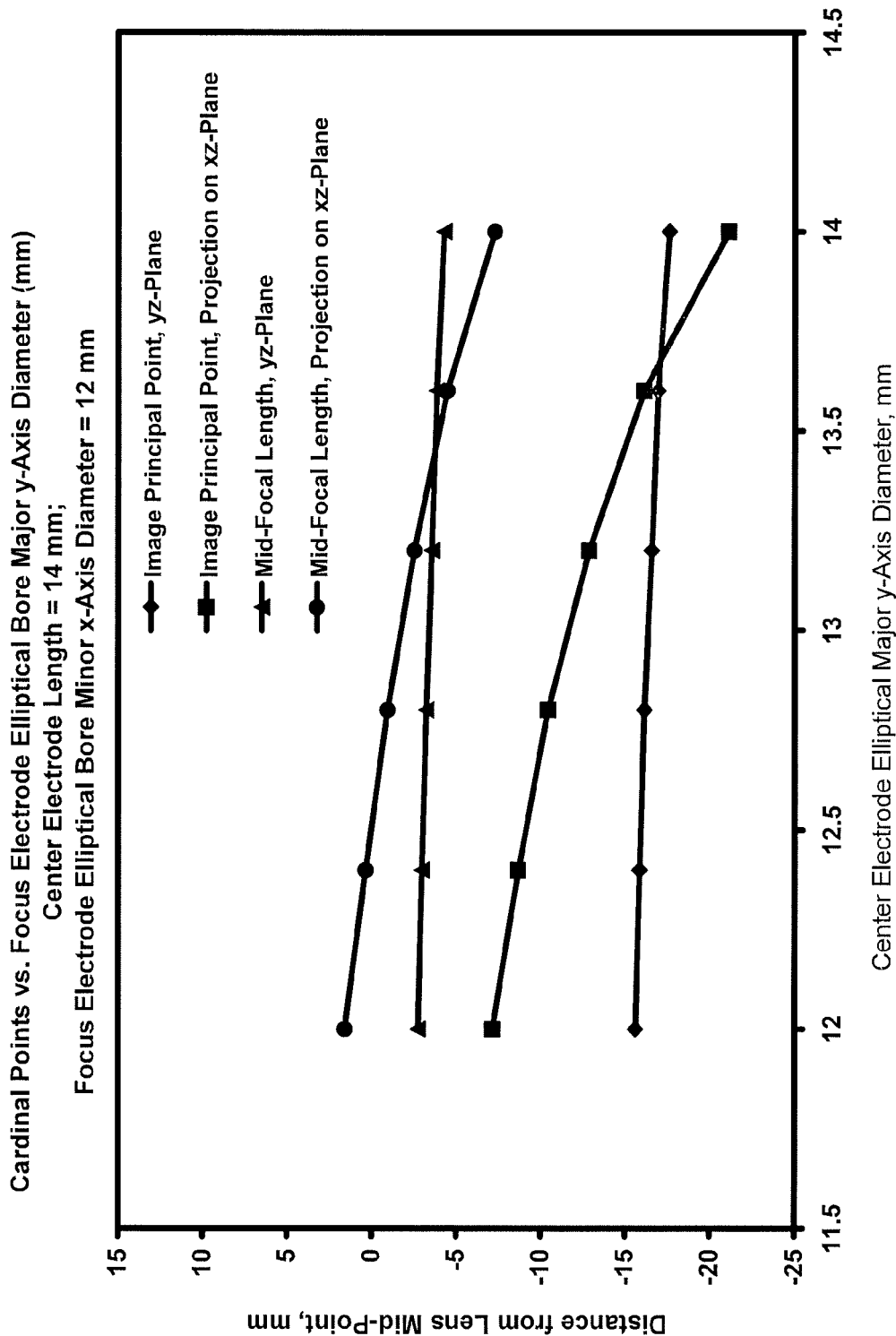
FIG. 16(b) is a plot of calculated lens parameters for the lens of FIG. 9(a) for an elliptical center electrode length of 14 mm and an elliptical minor axis diameter in the lens x-axis direction of 12 mm, as a function of the elliptical major axis diameter in the lens y-axis direction.
Figure 16C:
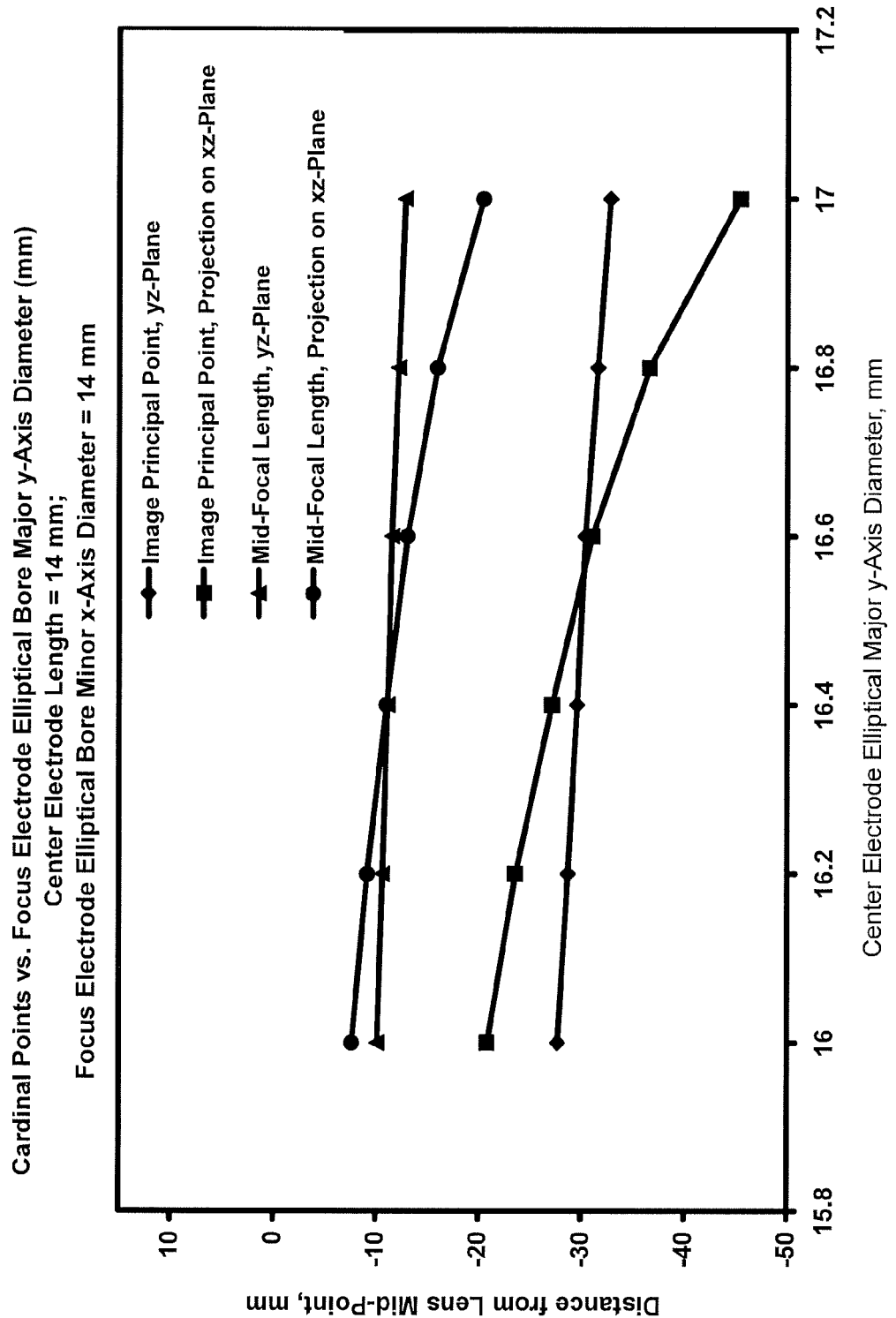
FIG. 16(c) is a plot of calculated lens parameters for the lens of FIG. 9(a) for an elliptical center electrode length of 14 mm and an elliptical minor axis diameter in the lens x-axis direction of 14 mm, as a function of the elliptical major axis diameter in the lens y-axis direction.
Figure 16D:
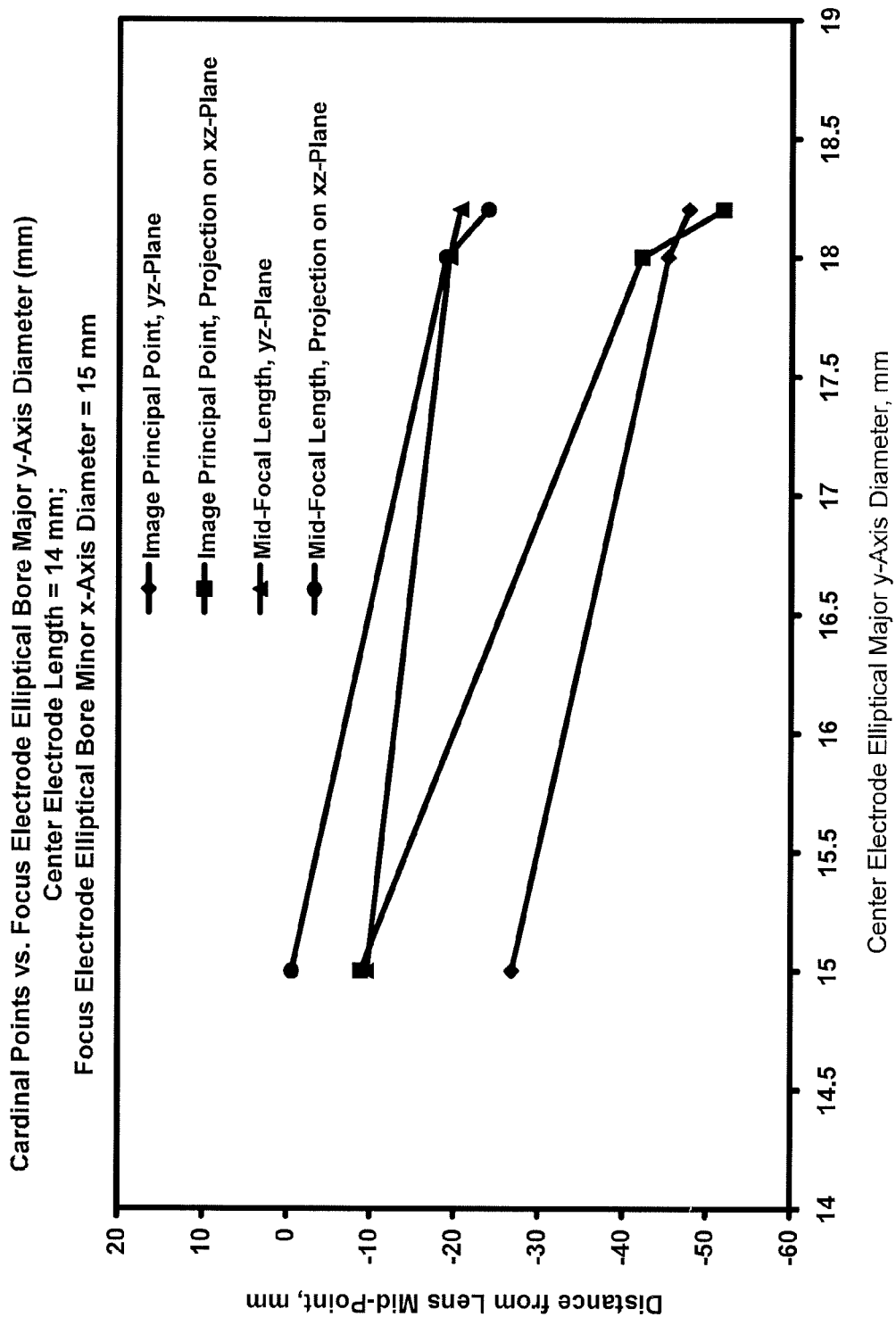
FIG. 16(d) is a plot of calculated lens parameters for the lens of FIG. 9(a) for an elliptical center electrode length of 14 mm and an elliptical minor axis diameter in the lens x-axis direction of 15 mm, as a function of the elliptical major axis diameter in the lens y-axis direction.

FIGS. 16(b), 16(c) and 16(d) show similar results for the cases when the minor axis dimension, oriented along the lens x-axis direction, is 12 mm, 14 mm, and 15 mm, respectively. In these cases, it is found that the y-z and x-z mid-focal lengths coincide, implying negligible astigmatism, for a major axis dimension of approximately 13.4 mm, 16.4 mm and 18.0 mm, respectively, again for an incoming parallel beam of 100 eV ions.

Figure 19A:
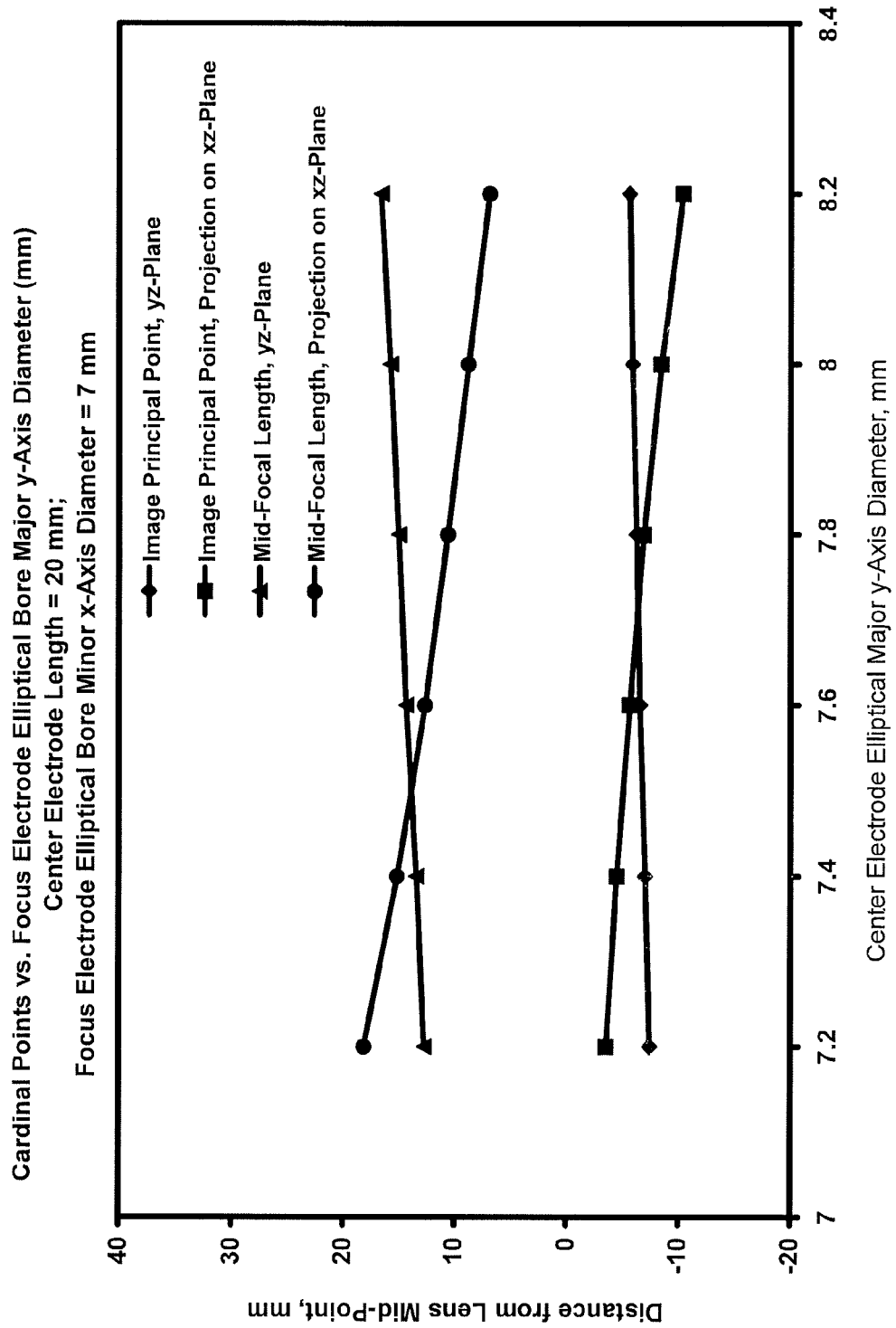
FIG. 19(a) is a plot of calculated lens parameters for the lens of FIG. 9(a) for an elliptical center electrode length of 20 mm and an elliptical minor axis diameter in the lens x-axis direction of 7 mm, as a function of the elliptical major axis diameter in the lens y-axis direction.
Figure 19B:
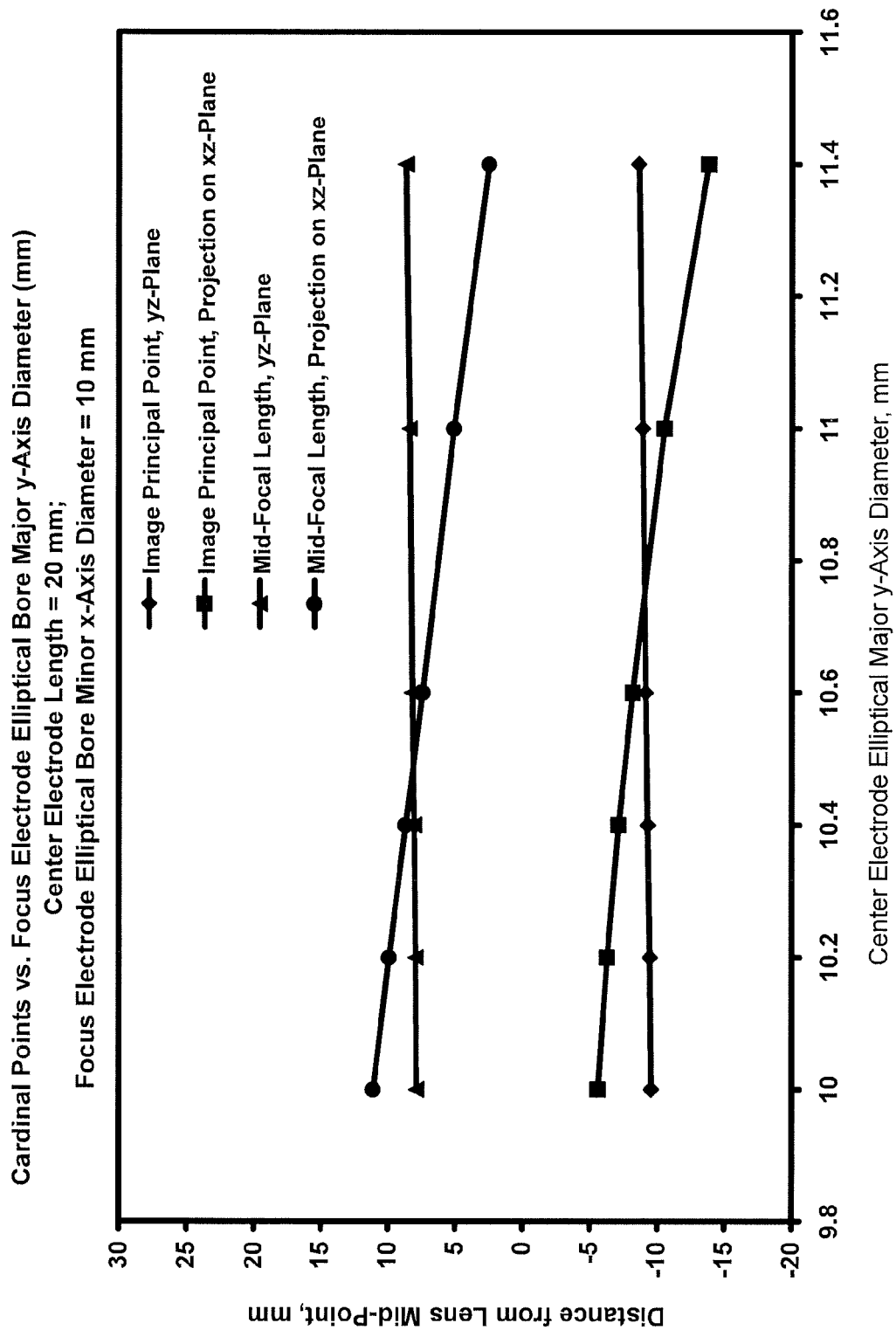
FIG. 19(b) is a plot of calculated lens parameters for the lens of FIG. 9(a) for an elliptical center electrode length of 20 mm and an elliptical minor axis diameter in the lens x-axis direction of 10 mm, as a function of the elliptical major axis diameter in the lens y-axis direction.
Figure 19C:
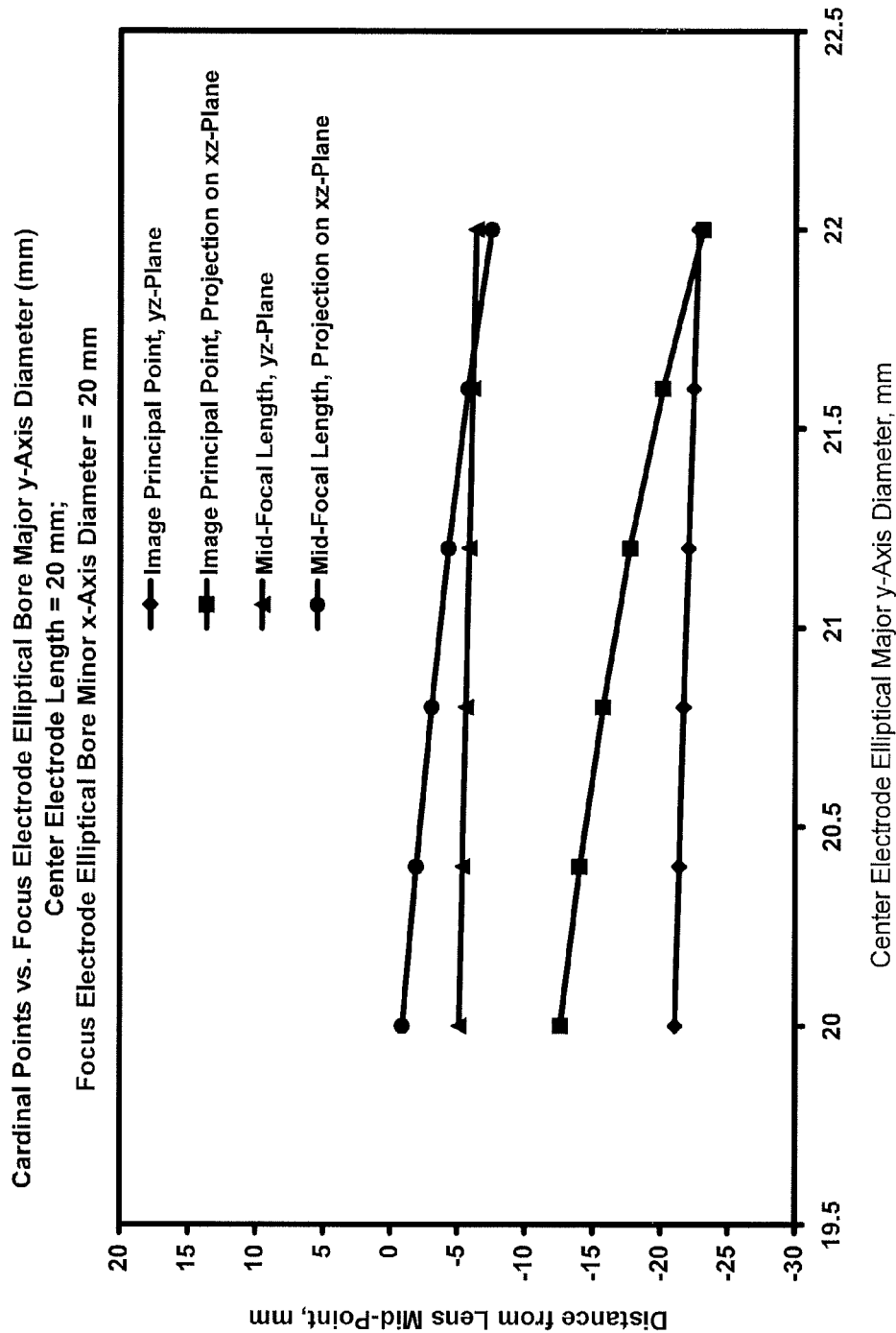
FIG. 19(c) is a plot of calculated lens parameters for the lens of FIG. 9(a) for an elliptical center electrode length of 20 mm and an elliptical minor axis diameter in the lens x-axis direction of 20 mm, as a function of the elliptical major axis diameter in the lens y-axis direction.

FIGS. 19(a), 19(b) and 19(c) show additional similar results for a lens similar to the lens of FIG. 16(a-d), but where the length of the center electrode is now 20 mm FIG. 19(a) show the results for which the elliptical hole/bore minor axis was oriented along the lens x-axis direction and held constant at 7 mm, and where the elliptical hole/bore major axis was oriented along the lens y-axis direction, and varied from 7.2 mm to 8.2 mm, while keeping the mid-plane of the hole/bore in the y-direction fixed at half-way between the incoming beam and lens entrance aperture axis, and the outgoing beam and lens exit aperture axis. It is apparent that the separation between the y-z and x-z mid-focal lengths coincides for a center hole/bore elliptical major axis dimension of approximately 7.7 mm, implying that beam astigmatism is negligible for these lens dimensions and potentials, and for an incoming parallel beam of 100 eV ions.

FIGS. 19(b) and 19(c) show similar results for the cases when the minor axis dimension, oriented along the lens x-axis direction, is 10 mm and 20 mm, respectively. In these cases, it is found that the y-z and x-z mid-focal lengths coincide, implying negligible astigmatism, for a major axis dimension of approximately 10.7 mm and 22 mm, respectively, again for an incoming parallel beam of 100 eV ions.

Figure 20:
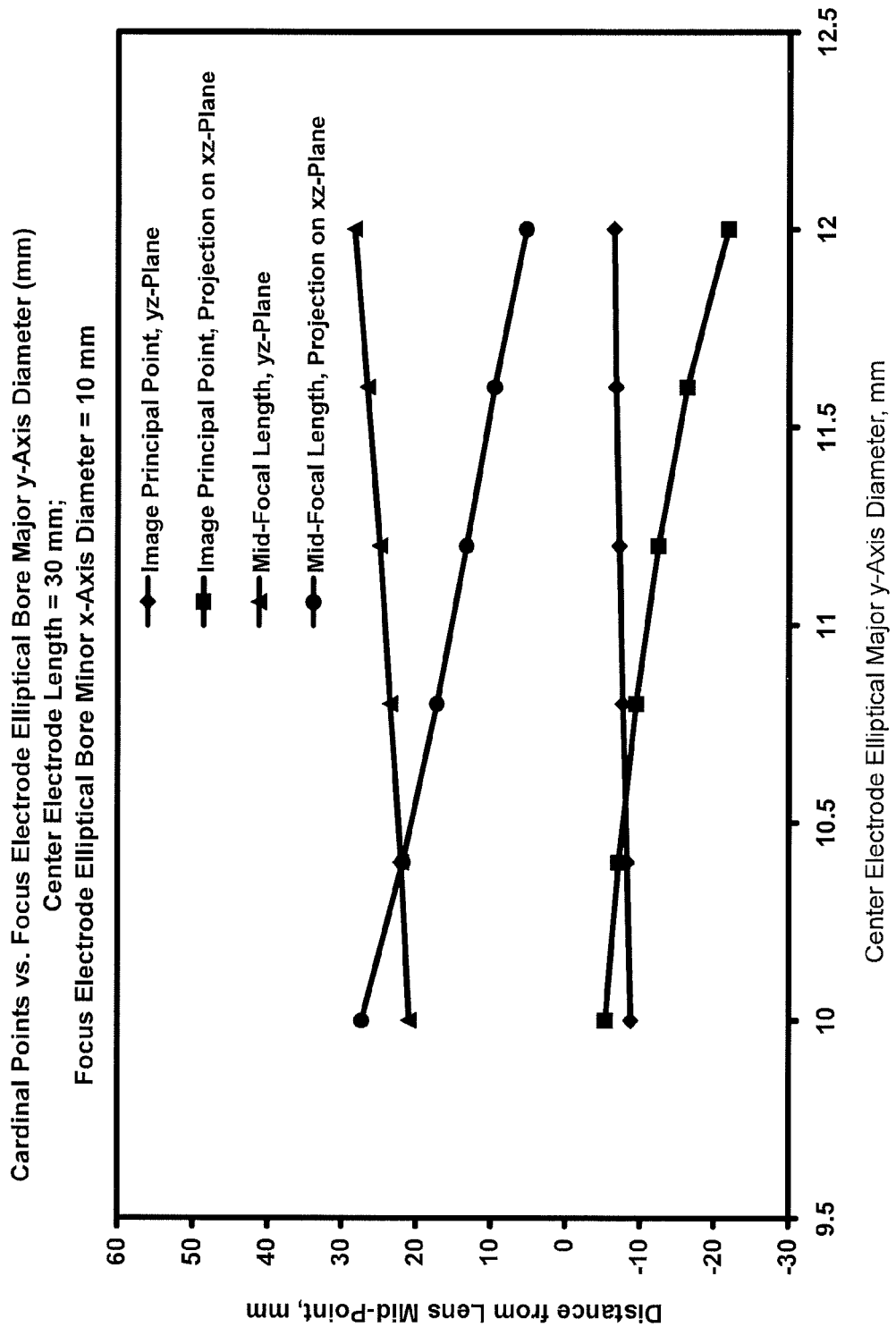
FIG. 20 is a plot of calculated lens parameters for the lens of FIG. 9(a) for an elliptical center electrode length of 30 mm and an elliptical minor axis diameter in the lens x-axis direction of 10 mm, as a function of the elliptical major axis diameter in the lens y-axis direction.

Finally, similar results are shown in FIG. 20 for the same lens but with a center electrode length of 30 mm, and having an elliptical minor axis hole/bore dimension, oriented along the lens x-axis direction, of 10 mm. It is apparent that such a center electrode elliptical hole shape with a major axis hole dimension in the y-direction of approximately 10.6 mm results in coincidence of the y-z and x-z mid-focal lengths, implying negligible astigmatism.

While such geometries have been demonstrated to yield negligible astigmatism, it should be noted that the corresponding principal points in the y-z and x-z planes for each of these lenses do not coincide, which results in an asymmetric angular distribution in the outgoing ion trajectories. In other words, an incoming round beam will be approximately elliptical in cross-section in the outgoing portion, even though astigmatism is negligible. It was also found that elimination of astigmatism could also be achieved with other hole/bore shapes in which the y-axis diameter is different from the x-axis diameter of the hole/bore. An example includes a hole/bore cross-sectional shape which has semi-circular ends, where the center axes of the semi-circular ends are offset by equal but opposite amounts from the hole/bore center axis, and the end points of the semi-circles are connected by straight sides of the hole/bore, resulting in an 'oval' or 'race track' hole/bore shape. In all such cases, the hole/bore shape exhibits a plane of symmetry normal to the y axis of the hole/bore, which plane of symmetry is always mid-way between the incoming beam and entrance aperture axis, and the outgoing beam and exit aperture axis.

Figure 17A:
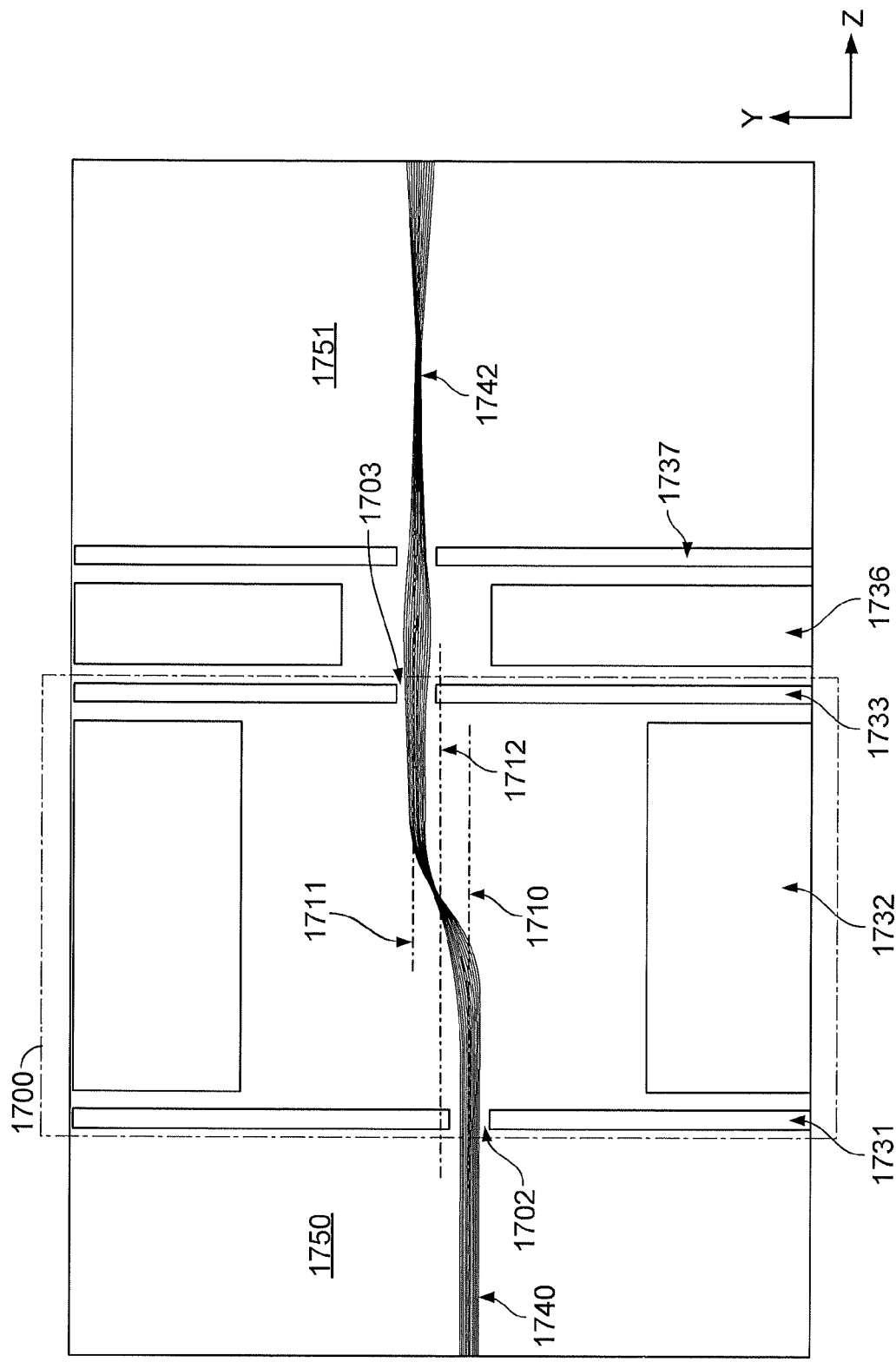
FIG. 17(a) is a cross-sectional view of the components shown in FIG. 9(a) with an elliptical center electrode length of 20 mm and an elliptical minor axis diameter in the lens x-axis direction of 20 mm and an elliptical major axis diameter in the lens y-axis direction of 22 mm, coupled to an additional focus lens.
Figure 17B:
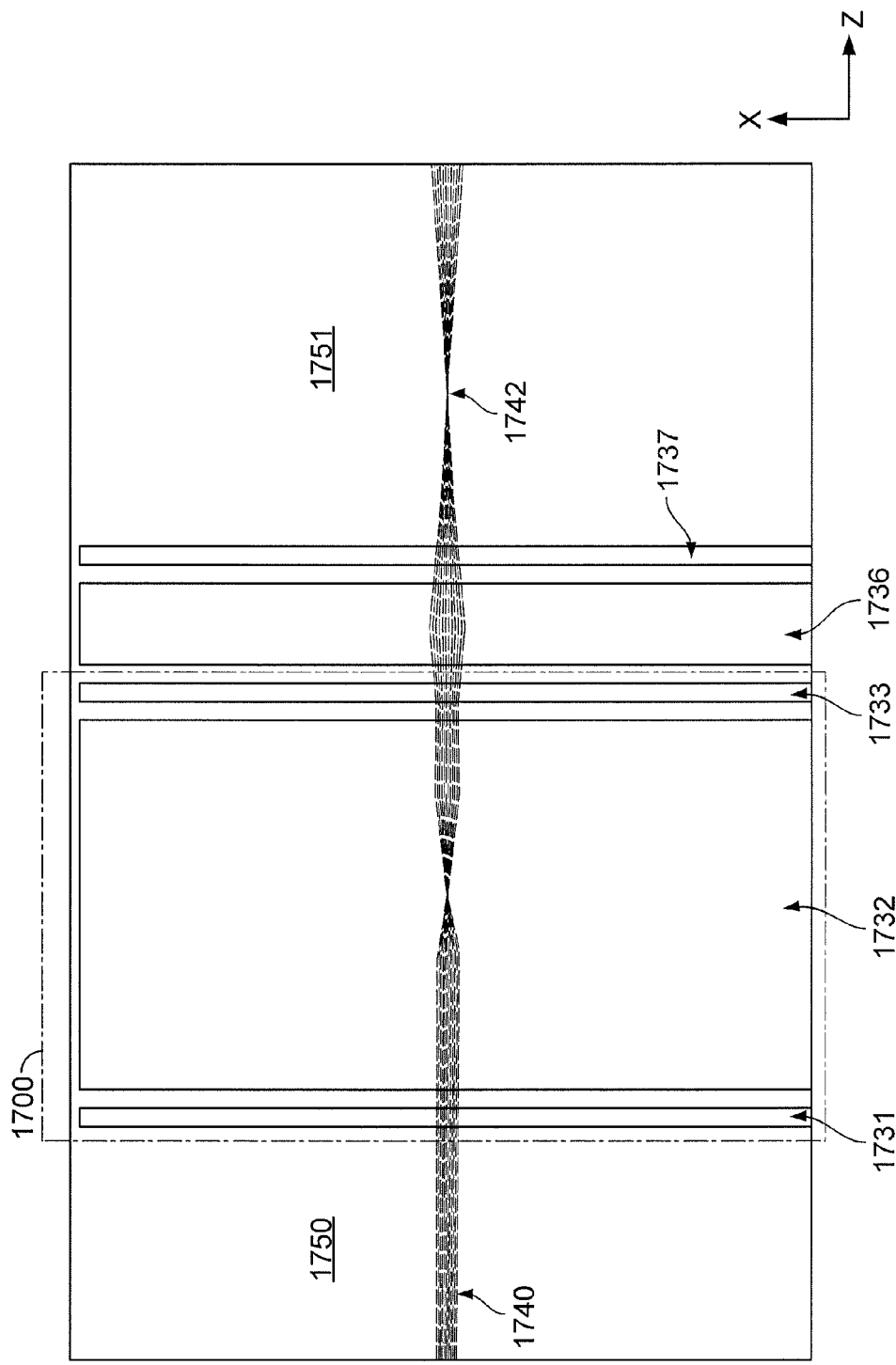
FIG. 17(b) is a top view of the components and trajectories shown in FIG. 17(a).

FIGS. 17(a) and 17(b) shows an example of combining an offset lens with negligible astigmatism with a subsequent 'Einzel' lens, which includes a focus electrode to provide a beam focus downstream at a variable location along the z-axis. The offset lens 1700 in this configuration has a center electrode with a length of 20 mm, with a hole/bore having an elliptical cross-section, with a minor axis diameter of 20 mm in the x-direction and a major axis diameter of 22 mm in the y-direction. All other dimensions of the lens 1700 are identical to those of lens 200 of FIG. 2(*a*). From the results shown in FIG. 19(*c*), such a lens geometry provides an outgoing beam with negligible astigmatism. Electrode 1736 and 1737 are configured with lens 1700 such that electrode 1733, 1736 and 1737 form a so-called 'Einzel' lens, where electrodes 1733 and 1737 have the same potential applied, and the electrode 1736 has a potential applied that is adjusted so as to form a beam focus down stream along axis 1711. The incoming parallel beam 1740 enters lens 1700 along axis 1710 with a kinetic energy of 100 eV. The potential applied to center electrode 1732 required to focus and steer this beam along the offset axis 1711 was found to be 128.0 v. when the outer electrodes 1731 and 1733 are operated at a potential of 0 v. The center electrode 1736 of the Einzel lens comprising electrodes 1733, 1736 and 1737, incorporated a round center hole/bore of 9 mm diameter concentric with axis 1711 and was 4.4 mm in axial length. For the focus conditions illustrated in FIGS. 17(*a*) and (*b*), a potential of 120 v. was applied to center electrode 1736 with the potential of electrode 1737 being 0 v. FIGS. 17(*a*) and 17(*b*) demonstrate that the focus 1742 occurs at essentially the same axial point along axis 1711, which implies that the outgoing beam is essentially stigmatic, owing to the ability of the offset lens 1700 to re-direct the beam from incoming axis 1710 to outgoing axis 1711 without introducing significant astigmatism.

Figure 18A:
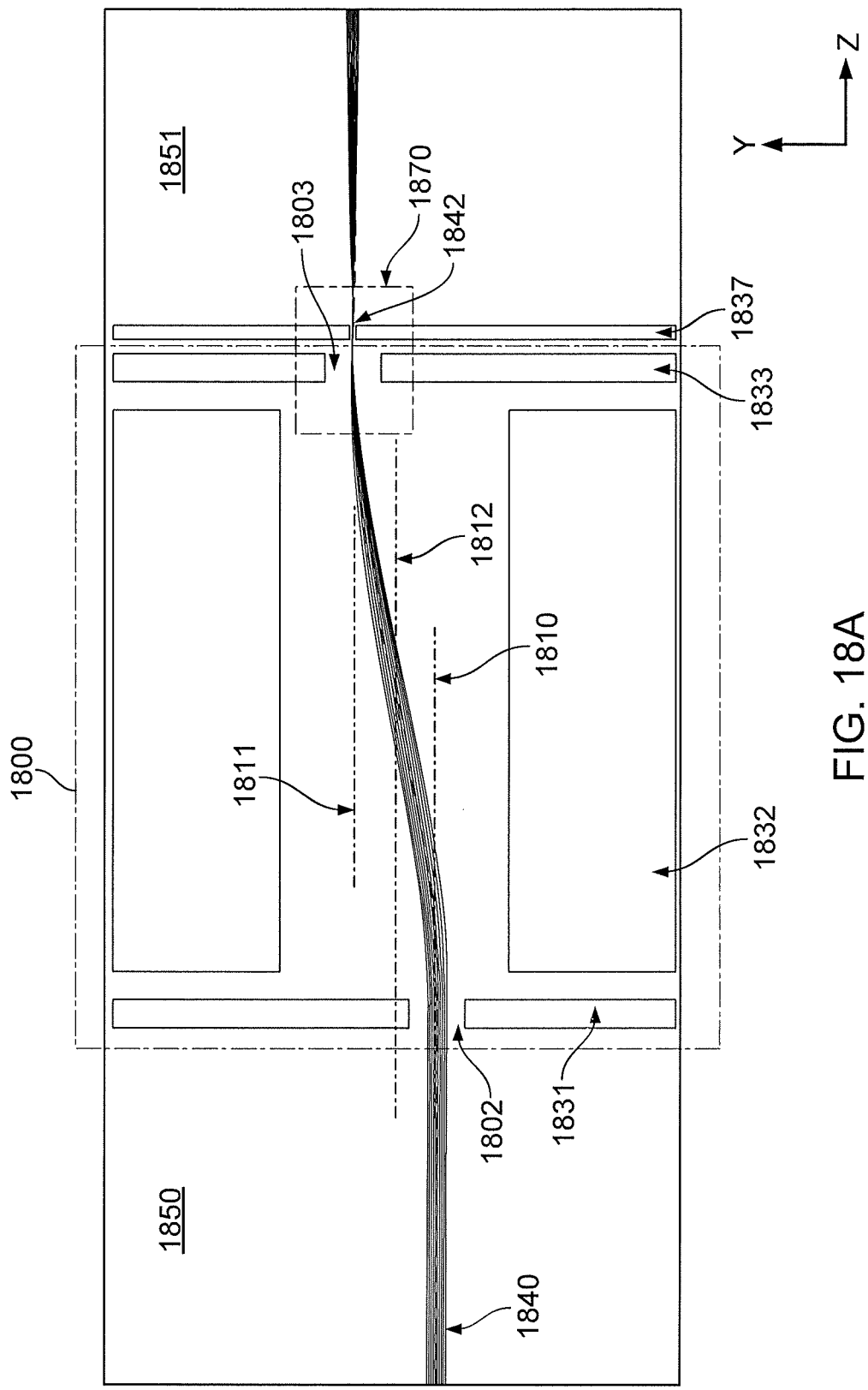
FIG. 18(a) is a cross-sectional view of the components shown in FIG. 9(a) with an elliptical center electrode length of 20 mm and an elliptical minor axis diameter in the lens x-axis direction of 7.5 mm and an elliptical major axis diameter in the lens y-axis direction of 8.1 mm, coupled to an additional aperture electrode for kinetic energy filtering.
Figure 18B:
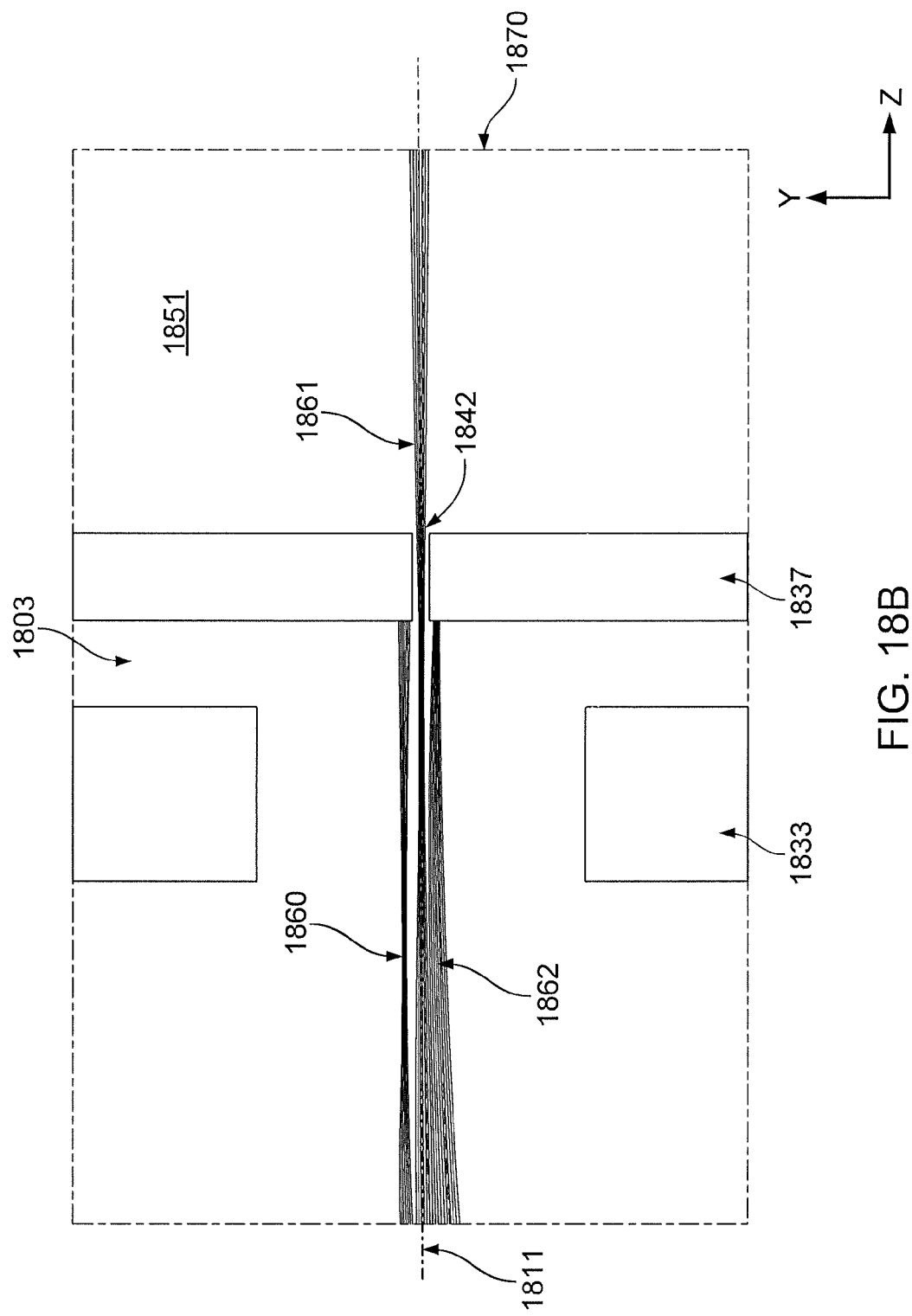
FIG. 18(b) is an expanded cross-sectional view of the lens exit region of FIG. 18(a).
Figure 18C:
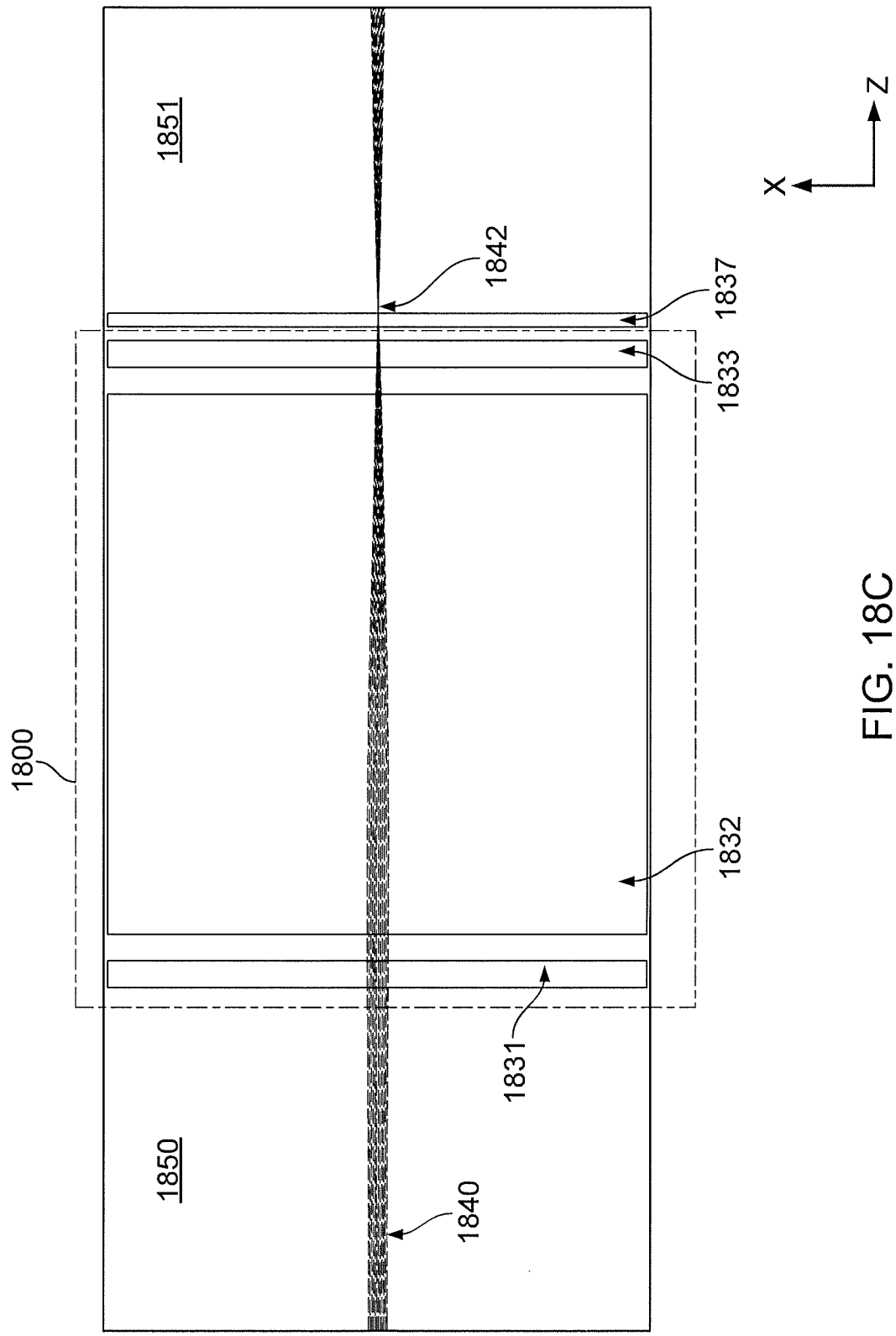
FIG. 18(c) is a top view of the components and trajectories shown in FIG. 18(a).

Another embodiment of the lens used as an energy filter or energy analyzer is shown in cross-section in FIG. 18(*a*). The lens 1800 has the same dimensions as the lens 1700 of FIG. 17, except that the center electrode hole/bore is elliptical in cross section with a major axis diameter in the y-direction of 8.1 mm and a minor axis diameter in the x-direction of 7.5 mm. As for all previous examples, the center axis 1812 of the hole/bore of the center electrode 1832 is half-way between the lens entrance axis 1810 and the lens exit axis 1811. With these lens dimensions, an incoming beam 1840 parallel to the entrance axis 1810 having a kinetic energy of 101 eV is focused and redirected to be parallel to the exit axis 1811 with a center electrode potential of 69.85 v. when the outer electrodes 1831 and 1833 are operated at 0.v potential. The beam is focused to a cross-over proximal to the exit electrode 1833.

The embodiment shown in FIG. 18(*a*) also includes a small aperture plate 1837 located just beyond the exit electrode 1833, approximately at the position of the beam cross-over focus, and is also operated at 0 v. potential. The plate 1837 contains a slit aperture 1842 which has dimensions of 0.1 mm in the y-direction and approximately 1 mm in the x-direction, which is centered on the beam axis 1811. This slit aperture is an energy-defining aperture, that is, only ions with the correct narrow range of kinetic energies will be able to pass through the aperture, because ions with greater and lesser kinetic energies will be focused higher and lower, respectively, in the y direction, and impact the aperture plate 1837. This energy filtering capability is demonstrated here by including ions in the parallel incoming beam 1840 with kinetic energies of 99 eV and 103 eV, in addition to the ions with 101 eV energy. An incoming parallel beam diameter of 0.7 mm was assumed for this demonstration. With the lens potentials set as described above to pass ions with 101 eV kinetic energy, FIG. 18(*a*) illustrate that the ions with 99 eV and 103 eV kinetic energy are stopped by the aperture plate 1837. This can be seen more clearly in the magnified view of region 1870 that is depicted in FIG. 18(*b*), where the ions 1862 with 103 eV kinetic energy focus below the slit aperture, while ions 1860 with 99 eV kinetic energy focus above the slit aperture 1842. FIG. 18(*c*) shows the projection of the lens and trajectories of FIGS. 18(*a*) and 18(*b*) in the x-z plane.

Such a lens can be used to filter out all but a narrow range of kinetic energies from an incoming charged particle beam. Alternatively, it is often useful to scan the potential applied to center electrode 1832 while measuring the transmitted current, which provides a measure of the distribution of kinetic energies in an incoming ion beam.

While the dimensions and shapes of the electrode apertures and hole/bore may vary, in certain embodiments, for example, with respect to the exemplary embodiment of lens 200 in FIG. 2(*a*), apertures 202 and 203 can have a diameter (i.e., dimension in the x-y plane) of less than 1 mm, or more (e.g., 2 mm or more, 3 mm or more, 4 mm or more, such as about 5 mm). The diameter of hole/bore 235 is generally larger than the diameter of apertures 202 and 203. In some embodiments, hole/bore 235 has a diameter of 5 mm or more (e.g., 7 mm or more, 10 mm or more, 12 mm or more, 15 mm or more, 20 mm or more). The length of hole/bore 235, L, can also vary as desired. In some embodiments, L is 5 mm or more (e.g., 8 mm or more, 10 mm or more, 12 mm or more, 15 mm or more, 20 mm or more). Furthermore, the distances that the axes of apertures 202 and 203 are separated may vary, although it will prove most effective that the combination of these offset dimensions and the diameters of the apertures be such that the line-of-sight from the entrance aperture 202 through the exit aperture 203 is minimized.

Generally, electrodes 231, 232, and 233 can be formed from a variety of electrically-conducting materials. For example, electrodes can be formed of a metal or alloy, such as stainless steel.

Generally, it is desirable to locate electrostatic lens 200 in a high vacuum region, since, as is well known in the art, any collisions between ions and background gas molecules will reduce the transmission efficiency of ions through the lens, as well as degrade the focal properties of the lens, due to uncontrolled scattering of ions from their original trajectories.

Figure 6:
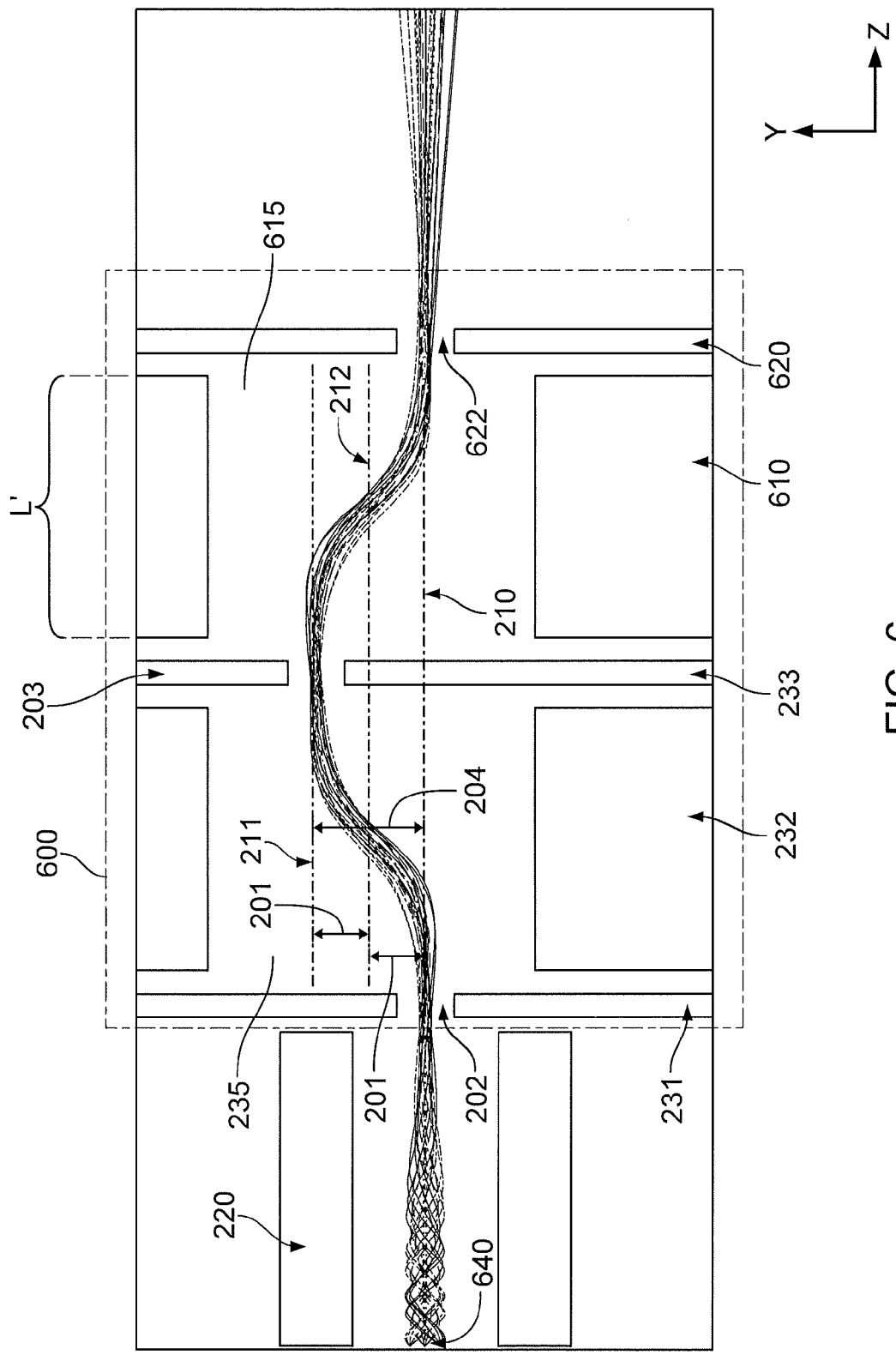
FIG. 6 shows a cross-sectional view of components of another embodiment of a mass spectrometry system.
Figure 7:
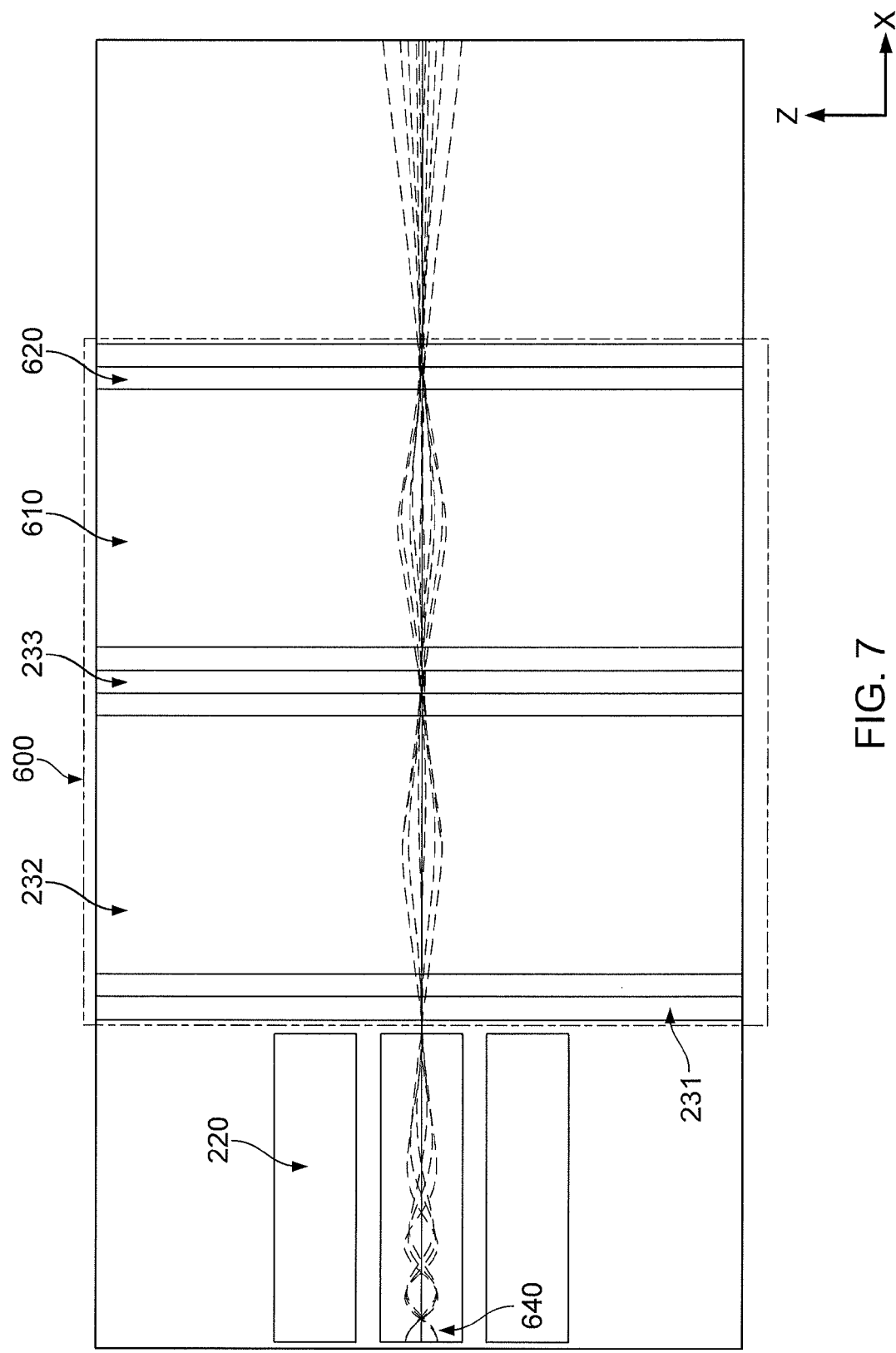
FIG. 7 is a top view of the components shown in FIG. 6.

While the lenses of all embodiments described so far, such as lens 200, include three component electrodes, other configurations are also possible. For example, electrostatic lenses can include additional electrodes to further influence the trajectory of ions transmitted through aperture 203. Referring to FIGS. 6 and 7, for example, an electrostatic lens 600 includes electrodes 610, 620, and 630 in addition to electrodes 231, 232, and 233. Electrode 610 includes a cylindrical hole/bore 615 that extends a length, L', along the z-axis. As depicted in FIG. 6, L' is the same as L, although, in general, L and L' can be the same or different. Hole/bore 615 is coaxial with hole/bore 235 of electrode 232. Electrodes 620 and 630 include apertures 622 and 632, respectively, which are both centered on axis 210, along with entrance aperture 202. Apertures 622 and 632 have the same diameter as each other, and the same diameter as aperture 202, although in general, the diameters of these apertures can vary relative to each other.

In some embodiments, the voltages on electrodes 231, 233, and 620 are set identically at the same value, while electrodes 232 and 610 are set at the same voltage as each other, but different from electrodes 231, 233, and 620. For example, ion beam trajectories 640 shown in FIGS. 6 and 7 are determined for the following voltage settings:

| Electrode | 231 | 232 | 233 | 610 | 620 |
|---|---|---|---|---|---|
| Voltage (V) | −100 | 11 | −100 | 11 | −100 |

For this example, the voltage of ion guide 120 was set at 0 V. For this configuration, the ion beam propagates along axis 210 through the ion guide and into electrostatic lens 600 through aperture 202, being focused to crossovers in the y-z and x-z planes, respectively. In hole/bore 235, the ion beam is displaced in the y-direction by an amount 204 and traverses aperture 203 into hole/bore 615. At aperture 203 the beam is again focused to a crossover. In hole/bore 615, lens 610 again displaces the beam by an amount 204, but this time in the −y-direction. The beam exits lens 600 through apertures 622 and 632, again being focused to crossovers in the y-z and x-z planes, respectively. The beam transmitted by lens 600 propagates along axis 210, which is the axis common with ion guide 220.

Accordingly, relative to lens 200 described above, lens 600 re-aligns the output beam axis with the initial/incident beam axis 210. Such a configuration can allow components downstream of the assembly 630 to be configured coaxially with the components upstream of the assembly, which may be advantageous, for example, in simplifying the overall mechanical design, or the fabrication, or both the mechanical design and fabrication of the mass spectrometry system in some applications.

In general, electrostatic lenses such as those described above can be used to focus an ion beam from a focus or crossover at a first axial location (e.g., at aperture 202 in lens 200) to a second axial location (e.g., at aperture 203) downstream from the first crossover position. The focusing can be achieved without significantly degrading the phase space properties (e.g., the cross-sectional size and/or angular distribution and/or kinetic energy spread) of the beam, while eliminating the more energetic charged and uncharged particles originally in the ion beam. The essentially stigmatic focusing properties demonstrated with the simulated models above can be achieved with particular combinations of the radial and axial dimensions of the lens structure, the shape of the central electrode hole/bore, and voltage combinations applied to the lens electrodes.

While certain embodiments have been described, it should also be understood that many variations are possible. For example, in some embodiments, there can be variations in geometrical designs and/or voltages applied to components in the lens assembly. For example, lenses can include electrodes having a non-planar shape, such as electrodes formed by segments of spherical surfaces, in addition to embodiments featuring apertures in flat plates electrodes detailed above. Similarly, the hole/bore of central lens electrode 232 and 610 may assume a different contour shape, such as curved or conical or conical segments, instead of the cylindrical hole/bores disclosed in the embodiments above. Furthermore, variations in electrode voltage combinations may be applied to achieve results similar to those demonstrated above. Further, any of the lenses described herein may be constructed such that any of the electrodes are comprised of two equal halves which are electrically isolated from each other, where the division of the electrode into halves is about a plane that includes the lens entrance and exit axes. By applying a differential potential between the two halves, in addition to the normal electrode potential required for beam focusing and re-direction in the y-direction, the beam traversing the lens may be steered in order to compensate for any misalignment between lens electrodes or beam direction in the x-direction.

Besides the use of electrostatic lens in mass spectrometry systems, electrostatic lenses and systems disclosed herein are also suitable for use in other systems or applications that feature different ion sources, or other charged particle sources. For instance, electron microscopes can benefit from the use of electrostatic lens to guide and direct signal electron beams. In addition, in surface analysis techniques such as secondary ion mass spectrometry (SIMS), the effects caused by the impingement of energetic neutral particles on a solid sample surface during ion beam bombardment and background noises that arise as a result thereof can also be mitigated by the disclosed lenses and systems.

Other embodiments are in the claims.

What is claimed is:

1. A system, comprising:
an electrostatic lens positioned in a path between a charged-particle source and a charged-particle detector; the electrostatic lens comprising:
a first electrode having a first aperture positioned in the path and aligned with a first axis;
a second electrode positioned in the path between the first electrode and the charged-particle detector, the second electrode having a second aperture positioned in the path and aligned with a second axis, the second axis being parallel to the first axis and displaced from the first axis along a first direction;
a third electrode positioned in the path between the first electrode and the second electrode, the third electrode extends between the first electrode and the second electrode, the third electrode comprising a tubular electrode having a first end and a second end, a cross section of the first end is identical in shape to a cross section of the second end; and a potential generator coupled to the first, second, and third electrodes, wherein during operation;
the potential generator applies a first potential to the first electrode, a second potential to the second electrode, and a third potential to the third electrode so that the electrostatic lens directs a beam of charged particles from the charged-particle source propagating along the first axis to propagate along the second axis,
the potential generator applies the first potential to the first electrode, the second potential to the second electrode, and the third potential to the third electrode so that the beam of charged particles converges, at a first location along the second axis, to a first minimum beam cross section measured along both the first direction and a direction perpendicular to the second axis, and the beam of charged particles converges, at a second location along the second axis, to a second minimum beam cross section measured along both the direction perpendicular to the second axis and a direction perpendicular to the first direction, the first location and the second location are outside the electrostatic lens.

2. The system of claim 1, wherein during operation the electrostatic lens guides charged-particles in the beam having kinetic energies within a first range through the second aperture while charged-particles entering the electrostatic lens through the first aperture having kinetic energies outside the first range are prevented from passing through the second aperture.

3. The system of claim 1, wherein the path at the first electrode is parallel to the path at the second electrode.

4. The system of claim 1, wherein the first and second electrodes are plate electrodes.

5. The system of claim 4, wherein the plate electrodes are parallel.

6. The system of claim 5, wherein the plate electrodes are orthogonal to the first and second axes.

7. The system of claim 1, wherein the third electrode includes a hole through which the path extends.

8. The system of claim 7, wherein the hole has a third axis.

9. The system of claim 7, wherein the hole has a hole cross-section that is the same throughout the entire third electrode.

10. The system of claim 7, wherein the hole has a cross-section that is different at at least one axial location than the hole cross-section at other axial locations.

11. The systems of claim 8, wherein the third electrode hole has a cylindrical cross-section, wherein the third axis is the axis of the cylindrical cross-section.

12. The systems of claim 8, wherein the third electrode hole has an elliptical cross-section having a major diameter and a minor diameter different from the major diameter, wherein the major diameter or the minor diameter is parallel to the first direction.

13. The systems of claim 8, wherein the third electrode hole has an oval cross-section, wherein the oval comprises a rectangle centered on the first hole axis, wherein first and second sides of the rectangle are parallel to the first direction, and third and fourth sides of the rectangle are perpendicular to the first direction, and wherein the oval further comprises a first and second cylinder, the first cylinder being centered on a mid-point of the third side of the rectangle, and the second cylinder being centered on a mid-point of the fourth side of the rectangle, wherein diameters of the first and second cylinders are the same as lengths of the third and fourth sides.

14. The system of claim 8, wherein the hole has a plane of symmetry which includes the third axis, and which is perpendicular to the first direction.

15. The system of claim 8, wherein the hole has a plane of symmetry which includes the third axis, and which also includes the first axis and the second axis.

16. The system of claim 8, wherein the hole has two planes of symmetry, both of which includes the third axis, wherein one symmetry plane is perpendicular to the first direction, and wherein the second symmetry plane also includes the first axis and the second axis.

17. The system of claim 8, wherein the third electrode comprises two half electrode sections electrically isolated from each other, each half section being a mirror-image of the other half-section, wherein a plane of symmetry between the half-sections includes the third axis, and the first and second axes, and wherein the potential generator further provides a differential voltage between the two half-sections.

18. The system of claim 10, wherein the third axis is parallel to the first and second axes and displaced in the first direction relative to the first axis and the second axis.

19. The system of claim 18, wherein the first and second axes are displaced from the third axis by the same amount.

20. The system of claim 1, wherein the first and second potentials are the same potential.

21. The system of claim 1, wherein the electrostatic lens further comprises:
a fourth electrode positioned in the path between the second electrode and the charged-particle detector, the fourth electrode having a third aperture positioned in the path and aligned with a fourth axis, the fourth axis being parallel to the second axis and displaced from the second axis along the first direction; and,
a fifth electrode positioned in the path between the second electrode and the fourth electrode.

22. The system of claim 21, wherein the fourth axis is co-axial with the first axis.

23. The system of claim 21, wherein during operation, the potential generator applies a fourth potential to the fourth electrode and a fifth potential to the fifth electrode so that the electrostatic lens directs the beam of charged particles from propagating along the first axis to propagate along the fourth axis.

24. The system of claim 23, wherein the fourth potential is the same as the first potential or the second potential.

25. The system of claim 23, wherein the fifth potential is the same as the third potential.

26. The system of claim 1, further comprising a vacuum chamber, wherein the electrostatic lens is positioned in the vacuum chamber.

27. The system of claim 1, further comprising one or more elements selected from the group consisting of a charged-particle guide, an electrostatic lens, a magnetic lens, an electrostatic deflector, and a magnetic deflector, the element being positioned in the path between the charged-particle source and the electrostatic lens.

28. The system of claim 27, wherein the element comprises a charged-particle guide, the charged-particle guide comprises a multipole charged-particle guide.

29. The system of claim 28, wherein the multipole charged-particle guide is a hexapole charged-particle guide.

30. The system of claim 1, wherein the charged-particle source is an ion source.

31. The system of claim 30, wherein the ion source operates essentially at atmospheric pressure.

32. The system of claim 1, further comprising a mass analyzer.

33. The system of claim 1, wherein one or more of the first, second, and third electrodes comprises a division of the electrode into two half sections along a plane that includes the first direction and the first axis, whereby a steering voltage may be applied to any of the half sections to steer the charged particles orthogonal to the plane.

34. A method, comprising:
directing a beam of charged-particles having a range of kinetic energies within a first energy range along a path through an entrance aperture of an electrostatic lens, the electrostatic lens comprising a first electrode that includes the entrance aperture and aligned with a first axis, a second electrode comprising a second aperture positioned in the path and aligned with a second axis, the second axis being parallel to the first axis and displaced from the first axis along a first direction, and a third electrode positioned in the path between the first and second electrodes, wherein the third electrode extends between the first electrode and the second electrode, the third electrode comprises a tubular electrode having a first end and a second end, a cross section of the first end is identical in shape to a cross section of the second end, and the first and second apertures are aligned with first and second parallel axes, respectively, and displaced from each other in a first direction;
applying voltages to the first, second, and third electrodes so that the beam is transmitted through the second aperture while charged-particles entering the electrostatic lens through the entrance aperture having kinetic energies outside the range of kinetic energies are blocked by the electrostatic lens;
converging the beam at a first location along the second axis to a first minimum beam cross section measured along both the first direction and a direction perpendicular to the second axis, and converging the beam at a second location along the second axis to a second minimum beam cross section measured along both the direction perpendicular to the second axis and a direction perpendicular to the first direction,
wherein the first location and the second location are outside the electrostatic lens.

35. The system of claim 1, wherein the first location coincides with the second location.

36. The method of claim 34, wherein the first location coincides with the second location.

\* \* \* \* \*

UNITED STATES PATENT AND TRADEMARK OFFICE
CERTIFICATE OF CORRECTION

| | |
|---|---|
| PATENT NO. | : 8,921,803 B2 |
| APPLICATION NO. | : 13/410646 |
| DATED | : December 30, 2014 |
| INVENTOR(S) | : David G. Welkie |

Page 1 of 1

It is certified that error appears in the above-identified patent and that said Letters Patent is hereby corrected as shown below:

In The Claims

In column 25, line 14, in Claim 11, delete "systems" and insert -- system --,

In column 25, line 17, in Claim 12, delete "systems" and insert -- system --,

In column 25, line 22, in Claim 13, delete "systems" and insert -- system --.

Signed and Sealed this
Twenty-ninth Day of September, 2015

Michelle K. Lee
*Director of the United States Patent and Trademark Office*